(12) United States Patent
Jin et al.

(10) Patent No.: US 11,627,266 B2
(45) Date of Patent: Apr. 11, 2023

(54) DEPTH PIXEL HAVING MULTI-TAP STRUCTURE AND TIME-OF-FLIGHT SENSOR INCLUDING THE SAME

(71) Applicant: SAMSUNG ELECTRONICS CO., LTD., Suwon-si (KR)

(72) Inventors: Younggu Jin, Osan-si (KR);
Youngchan Kim, Seongnam-si (KR);
Youngsun Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 17/173,290

(22) Filed: Feb. 11, 2021

(65) Prior Publication Data

US 2022/0021831 A1    Jan. 20, 2022

(30) Foreign Application Priority Data

Jul. 15, 2020    (KR) .................. 10-2020-0087667

(51) Int. Cl.
*H04N 5/369* (2011.01)
*H04N 5/341* (2011.01)
*G01S 7/4865* (2020.01)
*G01S 7/4863* (2020.01)
*G01S 17/894* (2020.01)

(52) U.S. Cl.
CPC ....... *H04N 5/36965* (2018.08); *G01S 7/4863* (2013.01); *G01S 7/4865* (2013.01); *G01S 17/894* (2020.01); *H04N 5/341* (2013.01)

(58) Field of Classification Search
CPC .. H04N 5/36965; H04N 5/341; G01S 7/4863; G01S 7/4865; G01S 17/894; G01S 7/4914; G01S 7/493; G01S 17/32; G01S 7/4817; G01S 17/08; G01S 7/481; G01S 17/933; H01L 27/14609

See application file for complete search history.

(56) References Cited

U.S. PATENT DOCUMENTS 8,537,218 B2    9/2013    Kawahito
8,665,422 B2    3/2014    Mase et al.
(Continued)

OTHER PUBLICATIONS

Kawahito; "A CMOS Time-of-Flight Range Image Sensor With Gates-on-Field-Oxide Structure"; Dec. 2007 (Year: 2007).*

*Primary Examiner* — Jared Walker
(74) *Attorney, Agent, or Firm* — F. Chau & Associates, LLC

(57) ABSTRACT

A depth pixel of a time-of-flight (ToF) sensor includes a common photogate disposed in a center region of the depth pixel, a plurality of floating diffusion regions disposed in a peripheral region surrounding the center region, a plurality of demodulation transfer gates disposed in the peripheral region, and a plurality of overflow gates disposed in the peripheral region. The demodulation transfer gates transfer a photo charge collected by the common photogate to the plurality of floating diffusion regions. The demodulation transfer gates are symmetric with respect to each of a horizontal line and a vertical line that pass through a center of the depth pixel and are substantially perpendicular to each other. The overflow gates drain the photo charge collected by the common photogate, and are symmetric with respect to each of the horizontal line and the vertical line.

19 Claims, 37 Drawing Sheets

(56) References Cited

U.S. PATENT DOCUMENTS

| | | |
|---|---|---|
| 8,792,087 B2 | 7/2014 | Spickermann et al. |
| 9,019,478 B2 | 4/2015 | Suzuki et al. |
| 9,664,780 B2 | 5/2017 | Mase et al. |
| 9,673,237 B2 | 6/2017 | Kim et al. |
| 2009/0152605 A1* | 6/2009 | Ohno ................ H01L 27/14609 257/432 |
| 2013/0020463 A1* | 1/2013 | Lee .................... H04N 5/36965 250/206 |
| 2013/0341750 A1* | 12/2013 | Ichikawa ................ H04N 9/07 257/440 |
| 2014/0198183 A1* | 7/2014 | Kim ...................... G01S 17/894 250/214 R |
| 2016/0356718 A1* | 12/2016 | Yoon .................... H03M 3/464 |
| 2017/0074643 A1* | 3/2017 | Chang ............... H01L 27/14614 |
| 2017/0146657 A1* | 5/2017 | Xu ........................ G01S 17/894 |
| 2017/0332029 A1* | 11/2017 | Feick ................... H04N 5/3745 |
| 2018/0197910 A1* | 7/2018 | Lee ........................ H04N 5/353 |
| 2020/0029047 A1 | 1/2020 | Jin et al. |
| 2022/0021831 A1* | 1/2022 | Jin ..................... H04N 5/36965 |

* cited by examiner

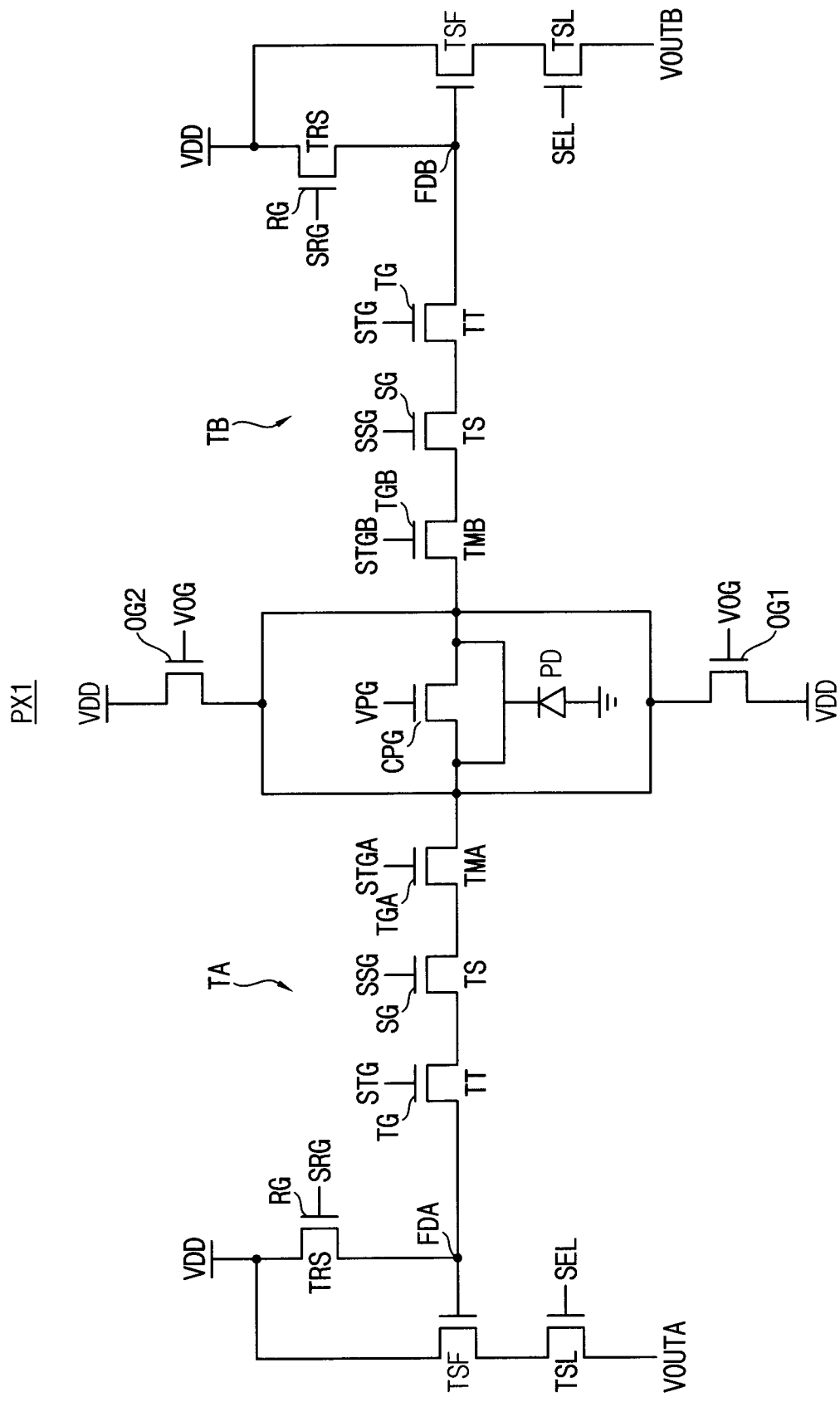

DEPTH PIXEL HAVING MULTI-TAP STRUCTURE AND TIME-OF-FLIGHT SENSOR INCLUDING THE SAME

CROSS-REFERENCE TO RELATED APPLICATION

This U.S. non-provisional application claims priority under 35 U.S.C. § 119 to Korean Patent Application No. 10-2020-0087667, filed on Jul. 15, 2020 in the Korean Intellectual Property Office (KIPO), the disclosure of which is incorporated by reference herein in its entirety.

TECHNICAL FIELD

Embodiments of the inventive concept relate generally to semiconductor integrated circuits, and more particularly, to a depth pixel having a multi-tap structure and a time-of-flight (ToF) sensor including the depth pixel.

DISCUSSION OF RELATED ART

Recently, interest in image sensing to acquire three-dimensional information of an object is increasing, and various three-dimensional cameras are being developed. A time-of-flight (ToF) sensor is a type of three-dimensional camera that includes a simple circuit configuration and high distance resolution. The ToF sensor illuminates an object with a transmission light using a light source, and calculates a distance to the object by measuring a phase difference of a flight time of a reception light reflected from the object using demodulation signals.

SUMMARY

Embodiments of the inventive concept may provide a depth pixel, and a time-of flight (ToF) sensor including at least one depth pixel, which is capable of efficiently measuring a distance to an object.

According to embodiments of the inventive concept, a depth pixel of a ToF sensor includes a common photogate disposed in a center region of the depth pixel, a plurality of floating diffusion regions disposed in a peripheral region surrounding the center region, a plurality of demodulation transfer gates disposed in the peripheral region, and a plurality of overflow gates disposed in the peripheral region. The plurality of demodulation transfer gates transfers a photo charge collected by the common photogate to the plurality of floating diffusion regions. The plurality of demodulation transfer gates is symmetric with respect to each of a horizontal line and a vertical line that pass through a center of the depth pixel and are substantially perpendicular to each other. The plurality of overflow gates drain the photo charge collected by the common photogate. The plurality of overflow gates is symmetric with respect to each of the horizontal line and the vertical line.

According to embodiments of the inventive concept, a ToF sensor includes a light source configured to illuminate an object with a transmission light, a pixel array including one or more depth pixels configured to provide information on a distance to the object based on a reflection light that is the transmission light reflected by the object, and a controller configured to control the light source and the pixel array. The depth pixel includes a common photogate disposed in a center region of the depth pixel, a plurality of floating diffusion regions disposed in a peripheral region surrounding the center region, and a plurality of demodulation transfer gates disposed in the peripheral region and configured to transfer a photo charge collected by the common photogate to the plurality of floating diffusion regions. The plurality of demodulation transfer gates is symmetric with respect to each of a horizontal line and a vertical line that pass through a center of the depth pixel and are substantially perpendicular to each other. The depth pixel further includes a plurality of overflow gates disposed in the peripheral region and configured to drain the photo charge collected by the common photogate. The plurality of overflow gates is symmetric with respect to each of the horizontal line and the vertical line.

According to embodiments of the inventive concept, a depth pixel of a ToF sensor includes a common photogate disposed in a center region of the depth pixel. The common photogate includes at least one vertical photogate extending in a vertical direction substantially perpendicular to an upper surface of a semiconductor substrate, and the at least one vertical photogate is disposed in a trench that is formed in an upper portion of the semiconductor substrate. The depth pixel further includes a plurality of floating diffusion regions disposed in a peripheral region surrounding the center region, a plurality of demodulation transfer gates disposed in the peripheral region and configured to transfer a photo charge collected by the common photogate to the plurality of floating diffusion regions, and a plurality of overflow gates disposed in the peripheral region and configured to drain the photo charge collected by the common photogate.

The depth pixel according to embodiments of the inventive concept may reduce the size and power consumption of the ToF sensor including the depth pixel by applying the common photogate. In addition, the depth pixel according to embodiments may increase sensing accuracy and sensing sensitivity through the symmetric structure and the modified structure of the common photogate, and increase performance of the ToF sensor including the depth pixel.

BRIEF DESCRIPTION OF THE DRAWINGS

The above and other features of the present disclosure will become more apparent by describing in detail embodiments thereof with reference to the accompanying drawings, in which:

FIG. 4 is a circuit diagram illustrating a depth pixel having a two-tap structure according to embodiments of the inventive concept.

DETAILED DESCRIPTION

Figure 1:
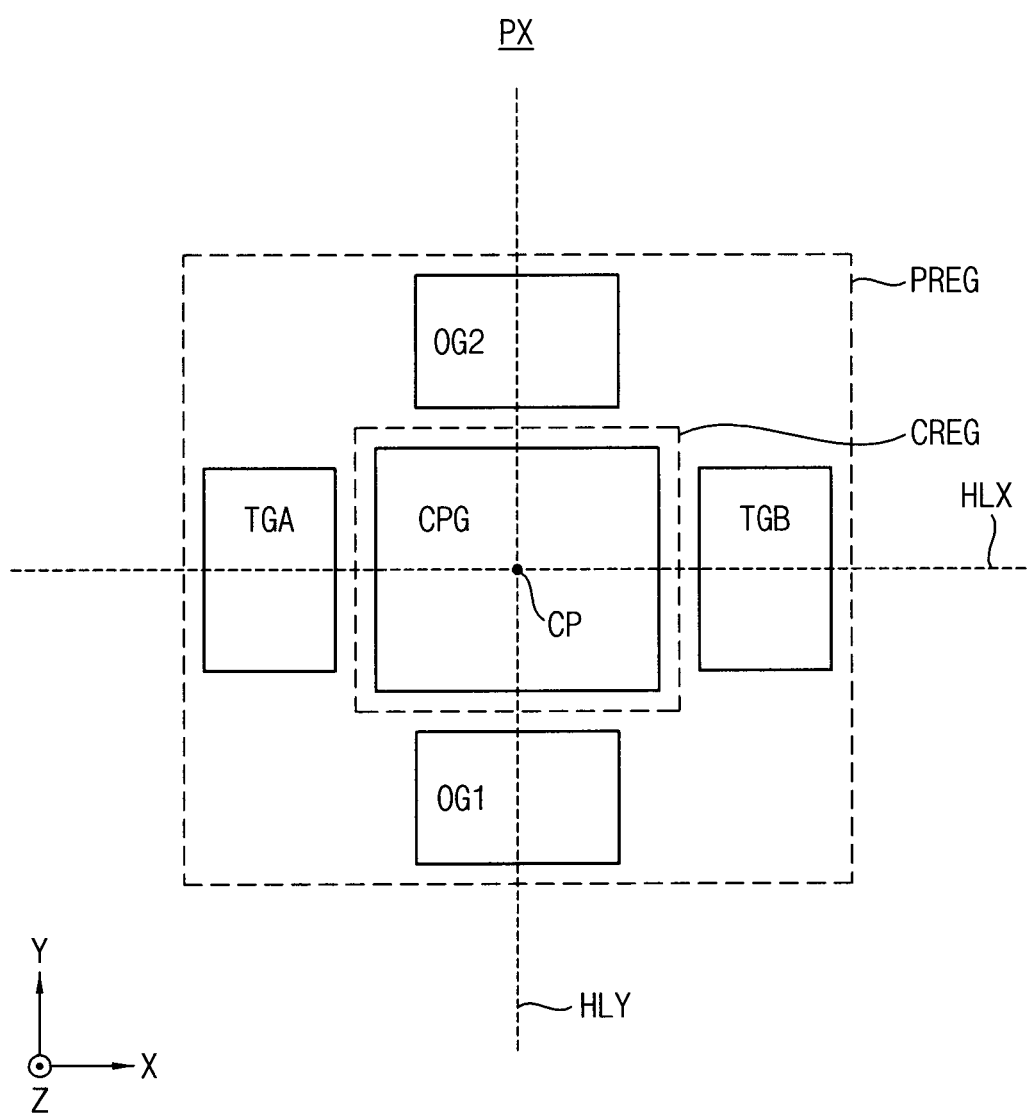
FIG. 1 is a diagram illustrating a layout of a depth pixel according to embodiments of the inventive concept.

Various embodiments will be described more fully hereinafter with reference to the accompanying drawings Like numerals may refer to like elements throughout the accompanying drawings. For convenience of explanation, repeated descriptions may be omitted.

The terms "first," "second," "third," etc. are used herein to distinguish one element from another, and the elements are not limited by these terms. Thus, a "first" element in an embodiment may be described as a "second" element in another embodiment.

Descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

When a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

When two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

When two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a diagram illustrating a layout of a depth pixel according to embodiments of the inventive concept. FIGS. 2A, 2B, 3A and 3B are cross-sectional views illustrating vertical structures of a depth pixel according to embodiments of the inventive concept.

Hereinafter, structures of an integrated circuit according to embodiments are described using a first horizontal direction X, a second horizontal direction Y, and a vertical direction Z in a three-dimensional space. The first horizontal direction X and the second horizontal direction Y may be substantially parallel with an upper surface of a semiconductor substrate and substantially perpendicular to each other. The vertical direction Z may be substantially perpendicular to the upper surface of the semiconductor substrate. The first direction X may be a row direction and the second direction Y may be a column direction.

Referring to FIGS. 1, 2A, 2B, 3A and 3B, a depth pixel PX may include a common photogate CPG, a plurality of floating diffusion regions FDA and FDB, a plurality of demodulation transfer gates TGA and TGB, and a plurality of overflow gates OG1 and OG2. FIGS. 1, 2A, 2B, 3A and 3B illustrate two floating diffusion regions FDA and FDB and two demodulation transfer gates TGA and TGB corresponding to a two-tap structure for convenience of illustration. However, the number of the floating diffusion regions and the demodulation transfer gates may be varied in embodiments depending on the number of taps of the depth pixel. In addition, the number of the overflow gates may be variously determined.

The common photogate CPG may be disposed in a center region CREG of the depth pixel PX, and the plurality of floating diffusion regions FDA and FDB, the plurality of demodulation transfer gates TGA and TGB, and the plurality of overflow gates OG1 and OG2 may be disposed in a peripheral region PREG surrounding the center region CREG.

The plurality of demodulation transfer gates TGA and TGB may transfer a photo charge collected by the common photogate CPG to the plurality of floating diffusion regions FDA and FDB, and the plurality of overflow gates OG1 and OG2 may drain the photo charge collected by the common photogate CPG. The operation of the depth pixel PX will be described below with reference to FIGS. 6 and 7.

The plurality of demodulation transfer gates TGA and TGB may be symmetric with respect to each of a horizontal line HLX (e.g., an imaginary horizontal line) and a vertical line HLY (e.g., an imaginary vertical line) that pass through a center CP of the depth pixel PX and are substantially perpendicular to each other. In addition, the plurality of overflow gates OG1 and OG2 may be symmetric with respect to each of the horizontal line HLX and the vertical line HLY.

In embodiments, as will be described below with reference to FIGS. 4 and 5, the depth pixel PX may further include a plurality of charge storing structures respectively disposed in the peripheral region PREG between the plurality of floating diffusion regions FDA and FDB and the plurality of demodulation transfer gates TGA and TGB. The plurality of charge storing structures may temporarily store the photo charge transferred from the common photogate CPG before transferring the photo charge to the plurality of floating diffusion regions FDA and FDB.

In a comparative example, a depth pixel includes a plurality of photogates, and a plurality of demodulation signals of different phases are applied to the plurality of photogates during an integration period for sensing the intensity of the incident light. In contrast, the depth pixel PX according to embodiments of the inventive concept includes one common photo gate CPG disposed in the center region CREG. As will be described below with reference to FIGS. 6 and 7, a plurality of demodulation signals of different phases are applied to the plurality of demodulation transfer gates TGA and TGB during the integration period in an embodiment. A photogate voltage applied to the common photogate CPG may have a direct current (DC) voltage level that causes collecting of the photo charge during the integration period, and an overflow gate voltage applied to the plurality of overflow gates OG1 and OG2 may have a turn-off voltage level that causes draining of the photo charge to be blocked during the integration period.

Figure 2A:
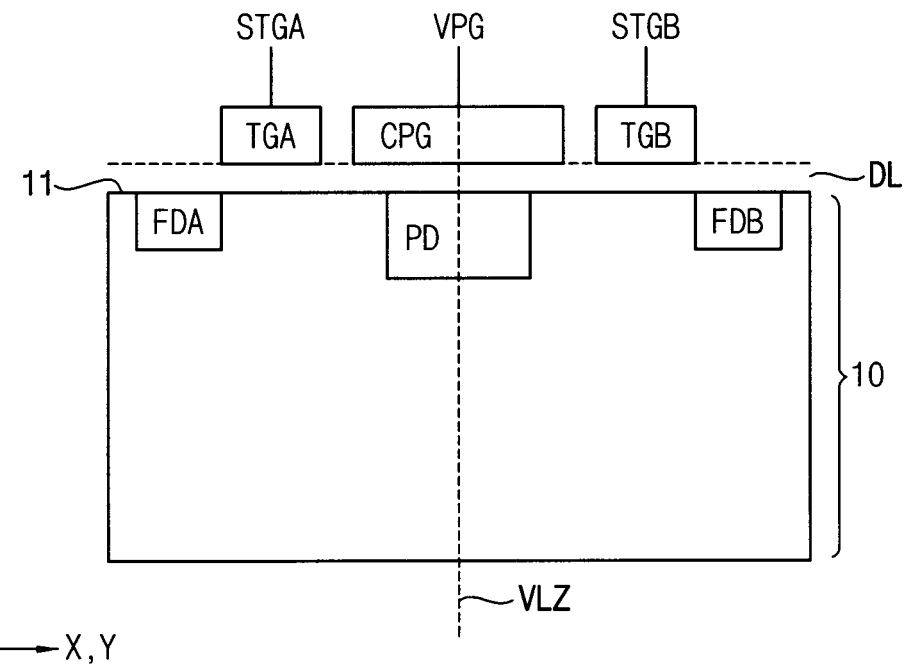
FIGS. 2A, 2B, 3A and 3B are cross-sectional views illustrating vertical structures of a depth pixel according to embodiments of the inventive concept.
Figure 2B:
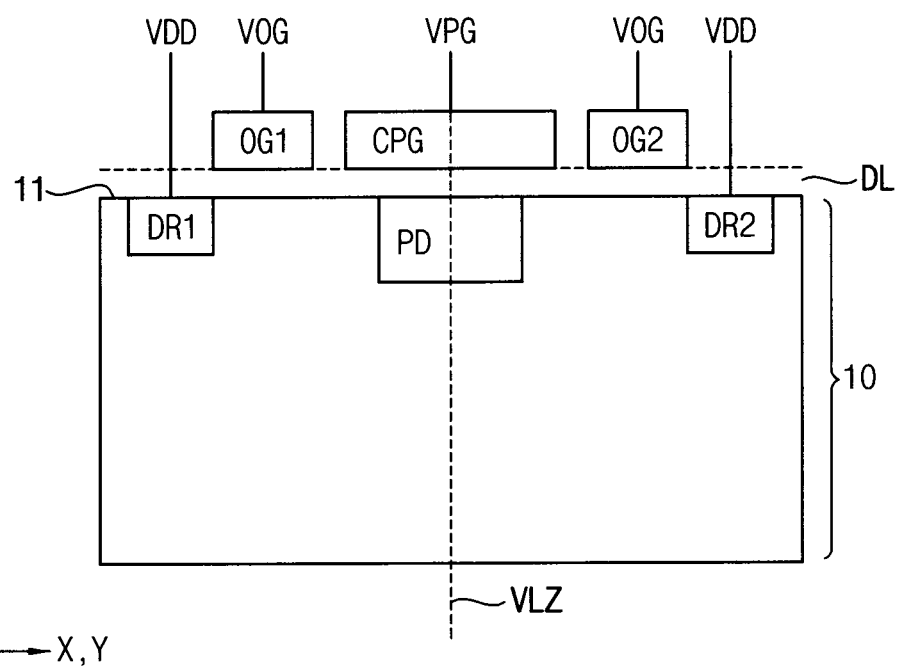

Referring to FIGS. 2A and 2B, a depth pixel PX may include floating diffusion regions FDA and FDB and drain regions DR1 and DR2 that are formed in a semiconductor substrate 10, and a common photo gate CPG, demodulation transfer gates TGA and TGB, and overflow gates OG1 and OG2 that are formed above the semiconductor substrate 10. The floating diffusion regions FDA and FDB, the drain regions DR1 and DR2, the common photo gate CPG, the demodulation transfer gates TGA and TGB, and the overflow gates OG1 and OG2 may be symmetric with respect to a vertical line VLZ passing through the center CP of the depth pixel PX.

The floating diffusion regions FDA and FDB and the drain regions DR1 and DR2 may be formed using, for example, an ion implantation process or the like. The common photo gate CPG, the demodulation transfer gates TGA and TGB, and the overflow gates OG1 and OG2 may be spaced apart from an upper surface 11 of the semiconductor substrate 10 using, for example, a deposition process, an etch process, etc. An insulation layer DL such as, for example, an oxide layer, may be formed between the upper surface 11 of the semiconductor substrate 10 and the gates CPG, TGA, TGB, OG1 and OG2.

The gates CPG, TGA, TGB, OG1 and OG2 may include, for example, polysilicon, a transparent conducting oxide (TCO) such as, for example, indium tin oxide (ITO), indium zinc oxide (IZO), zinc oxide (ZnO), titanium dioxide (TiO2), etc.

More particularly, for example, in one or more embodiments in which light incident on the depth pixel PX passes through the upper surface 11 of the semiconductor substrate 10, the gates CPG, TGA, TGB, OG1 and OG2 may include, for example, transparent conducting oxide. In an embodiment in which light incident on the depth pixel PX passes through a lower surface of the semiconductor substrate 10, the gates CPG, TGA, TGB, OG1 and OG2 may include, for example, a non-transparent conducting oxide.

The depth pixel PX may further include a photo charge storing region such as a photodiode PD formed under the common photo gate CPG in the semiconductor substrate 10. The photodiode PD may be spaced apart from the floating diffusion regions FDA and FDB and the drain regions DR1 and DR2. In embodiments, the semiconductor substrate 10 may be a P-type semiconductor substrate, and the photodiode PD may be doped with N-type impurities. However, embodiments are not limited thereto. For example, in embodiments, the semiconductor substrate 10 may be an N-type semiconductor substrate or may include an N-type well, and the photodiode PD may be doped with P-type impurities.

A photogate voltage VPG may be applied to the common photo gate CPG, and demodulation signals STGA and STGB may be applied to the demodulation transfer gates TGA and TGB, respectively. The demodulation signals STGA and STGB may have different phases, and the photo charge corresponding to the phases of the demodulation signals STGA and STGB may be transferred to the floating diffusion regions FDA and FDB, respectively.

An overflow voltage VOG may be applied to the overflow gates OG1 and OG2, and a power supply voltage VDD may be applied to the drain regions DR1 and DR2. The overflow voltage VOG may have a turn-off voltage level that causes draining of the photo charge to be blocked during the integration period, and a turn-on voltage level that causes the photo charge collected by the common photogate during the other periods such as a reset period and a readout period to be drained. During the other periods except the integration period, channels may be formed by the turn-on voltage level in the semiconductor substrate between the photodiode PD and the drain regions DR1 and DR2, and the collected photo charge in the common photo gate CPG may be drained to the terminal of the power supply voltage VDD. As such, a global shutter function may be implemented using the overflow gates OG1 and OG2.

A time-of-flight (TOF) photo-detection device measures light reflected by an object to determine a distance to the object. Typically, a lock-in-type detection method using two taps or four taps corresponding to different phases is widely used to determine the distance.

In the typical lock-in-type detection method, theses taps are phase-shifted from each other by about 180 degrees (in the case of two taps) or about 90 degrees (in the case of four taps), and a sinusoidally modulated wave or a pulse train signal of about 50% duty cycle is used for the taps. For the lock-in-type detection method, a depth pixel having a multi-tap structure is generally used in which a photo charge storing region and/or a photo charge generating region such as the photodiode PD may be shared by a plurality of floating diffusion regions.

Figure 3A:
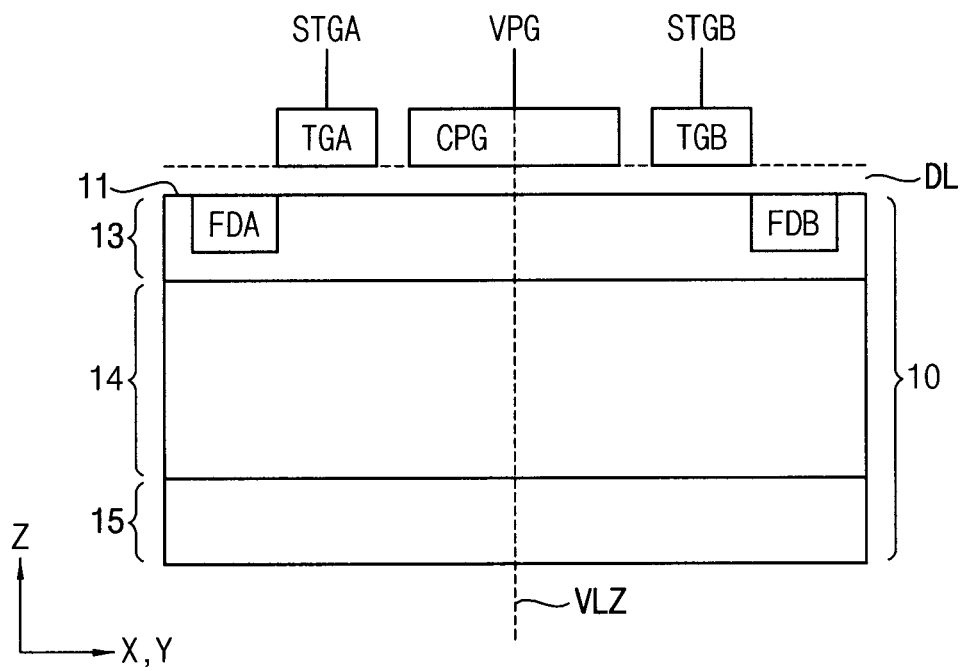
Figure 3B:
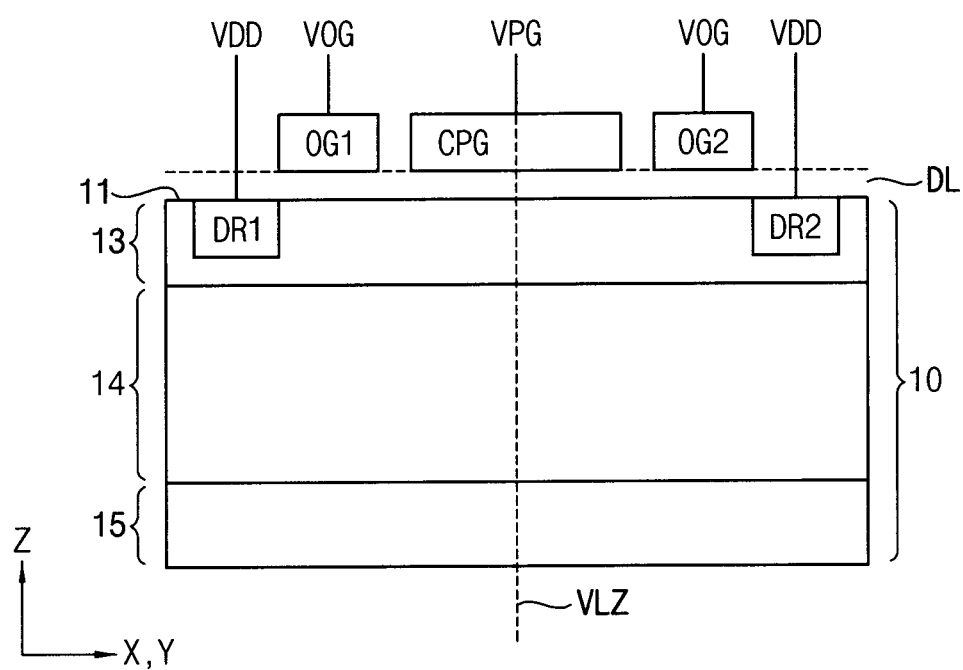

In comparison with the vertical structure of FIGS. 2A and 2B, the semiconductor substrate 10 may include a plurality of regions 13, 14 and 15 that are doped with impurities of different conductivity types and/or different concentrations as illustrated in FIGS. 3A and 3B. For example, in a case in which the semiconductor substrate 10 has P-type conductivity, the semiconductor substrate 10 may include, in order from the upper surface 11 of the semiconductor substrate 10, an N– region 13, a P– region 14 and a P+ region 15. The N– region 13 is doped with N-type impurities while the P– region 14 and the P+ region 15 are doped with P-type impurities. The P– region 14 is more lightly doped than the P+ region 15.

In a case in which near-infrared (NIR) light having a wavelength ranging from about 700 nm to about 850 nm is used as a light source in a TOF sensor, a P-type semiconductor substrate may be used as the semiconductor substrate 10.

Photons incident on the depth pixel PX may enter the P– region 14, and may generate electron-hole pairs in the P– region 14. That is, the P– region 14 may correspond to a main photo charge generating region where photo charges may be mainly generated. Photo-electrons generated as minority carriers may move into a depletion region of an N-P junction at a boundary between the N– region 13 and the P– region 14, and may then be diffused and collected by the common photo gate CPG. Since the P+ region 15, which is heavily doped compared to the P– region 14, is located below the P– region 14, the photo-electrons generated near a boundary between the P– region 14 and the P+ region 15 may tend to move into the N-P junction portion.

According to embodiments, the N– region 13 may be replaced with a P region. As a result of this P region being disposed above the P– region 14, the photo electrons may be blocked when the gates CPG, TGA, TGB, OG1 and OG2 are in the turned-off state, and may be transferred when the gates CPG, TGA, TGB, OG1 and OG2 are in the turned-on state.

As such, the semiconductor substrate 10 may include a plurality of photo charge generating regions 13, 14 and 15 that are doped with impurities of different conductivity types and/or different concentrations, which may increase sensitivity of the depth pixel PX. In addition, the photodiode PD may be formed in addition to the photo charge generating regions 13, 14 and 15.

FIG. 4 is a circuit diagram illustrating a depth pixel having a two-tap structure according to embodiments of the inventive concept. FIG. 5 is a diagram illustrating an example of a layout of the depth pixel having the two-tap structure of FIG. 4 according to embodiments of the inventive concept. Hereinafter, for convenience of explanation, a further description of elements and technical aspects previously described with reference to FIGS. 1, 2A, 2B, 3A and 3B may be omitted.

Figure 5:
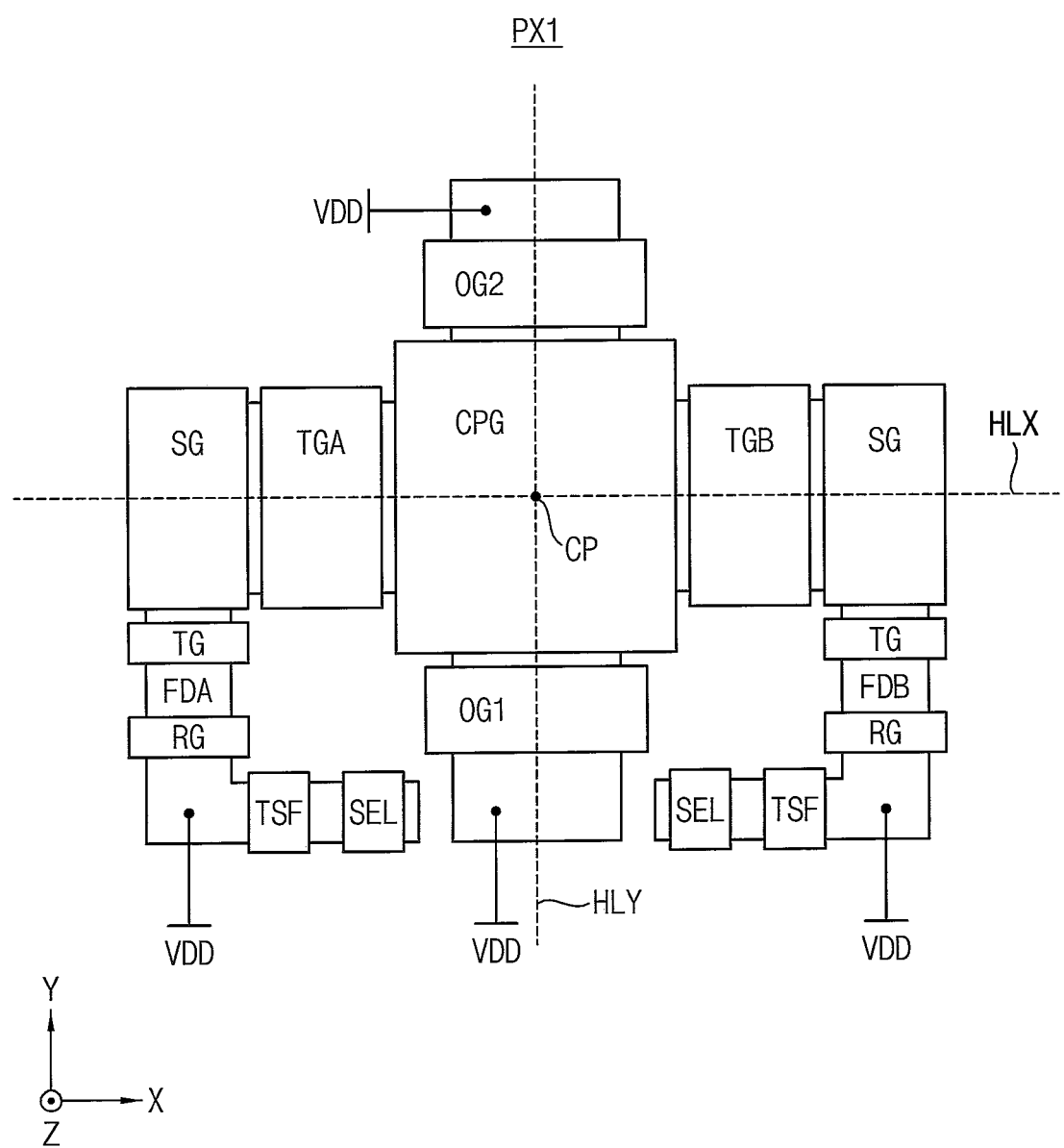
FIG. 5 is a diagram illustrating an example of a layout of the depth pixel having the two-tap structure of FIG. 4 according to embodiments of the inventive concept.

Referring to FIGS. 4 and 5, a depth pixel PX1 may include transistors TMA, TS and TT corresponding to a first tap TA, transistors TMB, TS and TT corresponding to a second tap TB, transistors TRS, TSF and TSL corresponding to a readout circuit, and a common photo gate CPG, overflow gates OG1 and OG2 and a photodiode PD corresponding to a shared circuit.

Each of the transistors TMA, TMB, TS, TT and TRS may include a gate disposed above a semiconductor substrate and source and drain regions disposed at both sides of the gate in the semiconductor substrate. The gates of the transistors TMA, TMB, TS, TT and TRS correspond to a first demodulation transfer gate TGA, a second demodulation transfer gate TGB, storage gates SG, and floating diffusion (FD) transfer gates TG and reset gates RG, respectively.

A photogate voltage VPG is applied to the common photo gate CPG, an overflow gate voltage VOG is applied to the overflow gates OG1 and OG2, a storage control signal SSG is applied to the storage gates SG, an FD transfer control signal STG is applied to the FD transfer gates TG, a reset signal SRG is applied to the reset gates RG, and a selection signal SEL is applied to the gate of the selection transistors TSL. A first demodulation signal STGA and a second demodulation signal STGB having different phases are applied to the first demodulation transfer gate TGA and the second demodulation transfer gate TGB, respectively.

The photogate voltage VPG, the overflow gate voltage VOG, the storage control signal SSG, the FD transfer control signal STG, the reset signal SRG, the selection signal SEL, and the demodulation signals STGA and STGB may be provided from a row scanning circuit 130 under control of a controller 150, as will be described below with reference to FIG. 10.

The storage gate SG is one of charge storing structures that temporarily store the photo charge transferred from the common photogate CPG before transferring the photo charge to the floating diffusion regions FDA and FDB. In embodiments, the charge storing structure may be implemented with the storage gate SG alone. In embodiments, the charge storing structure may be implemented with the storage gate SG and a storage diode formed in the semiconductor substrate under the storage gate SG. Using such a charge storing structure, true correlated double sampling (CDS) may be performed and noise in the readout signals may be reduced. According to embodiments, the FD transfer gates TG and/or the storage gates SG may be omitted.

The charge stored in the floating diffusion regions FDA and FDB may be provided as output signal VOUTA and VOUTB using the source follower transistors TSF and the selection transistors TSL.

As illustrated in FIG. 5, the one common photo gate CPG may be disposed in the center region of the depth pixel PX1, and the demodulation transfer gates TGA and TGB and the overflow gates OG1 and OG2 may form a symmetric structure with respect to the common photo gate CPG. For example, the demodulation transfer gates TGA and TGB may be symmetric with respect to each of the horizontal line HLX and the vertical line HLY, that is, symmetric with respect to the center CP of the depth pixel PX1. In addition, the overflow gates OG1 and OG2 may be symmetric with respect to each of the horizontal line HLX and the vertical line HLY, that is, symmetric with respect to the center CP of the depth pixel PX1. Through such a symmetric structure, deviations of operational characteristics of the taps TA and TB may be reduced and the sensing accuracy of the depth pixel PX1 may be increased.

Figure 6:
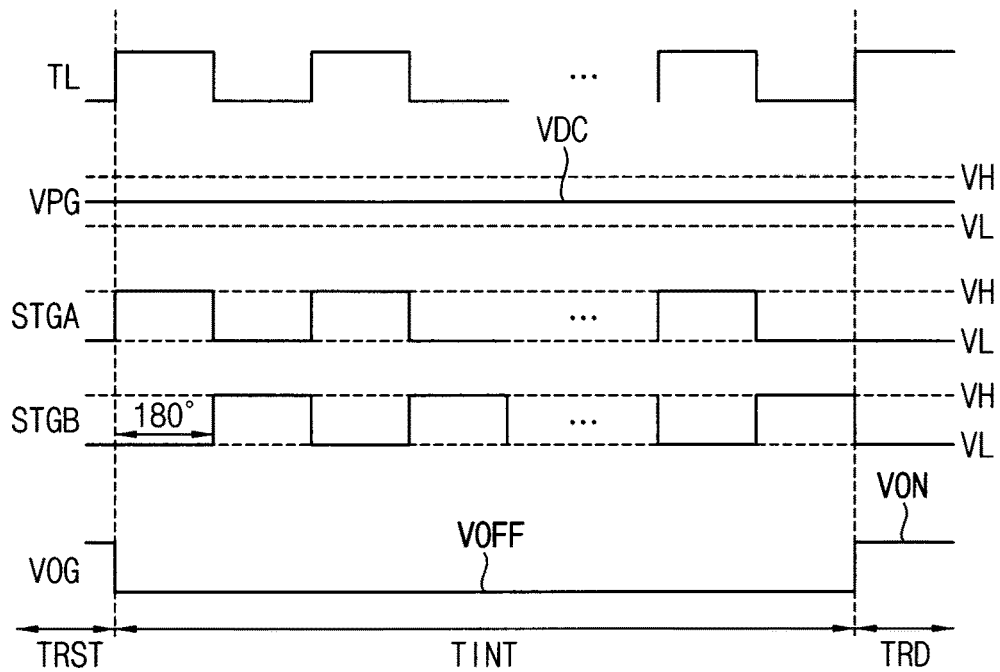
FIGS. 6 and 7 are timing diagrams illustrating examples of an operation of the depth pixel having the two-tap structure of FIG. 4 according to embodiments of the inventive concept.
Figure 7:
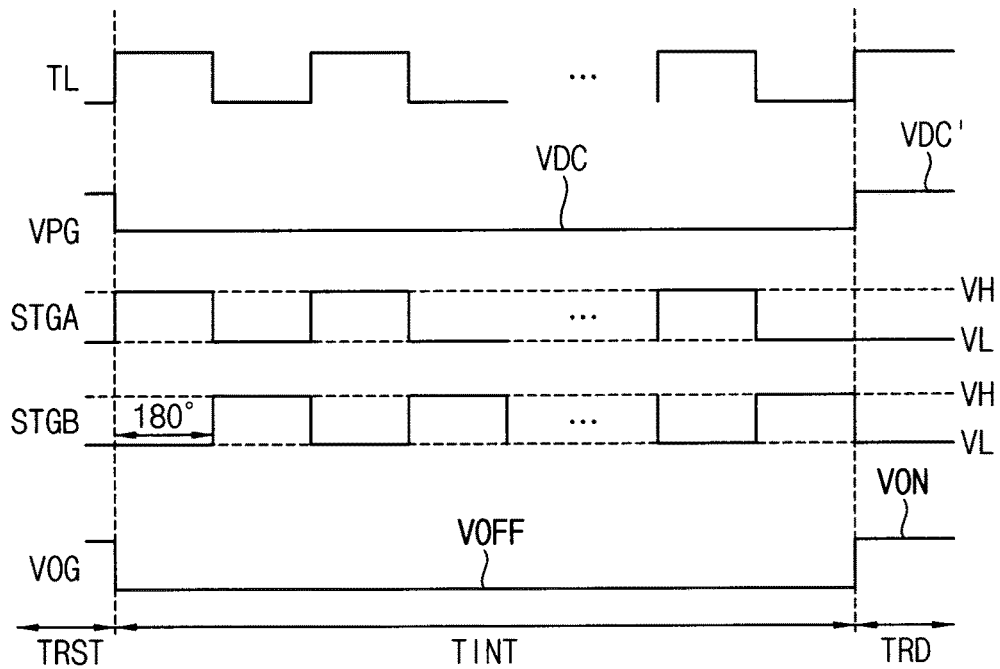

FIGS. 6 and 7 are timing diagrams illustrating examples of an operation of the depth pixel having the two-tap structure of FIG. 4 according to embodiments of the inventive concept.

Referring to FIGS. 4 through 7, during the integration period TINT, the photogate voltage VPG applied to the common photogate CPG may have a DC voltage level VDC that causes collecting of the photo charge, and the overflow gate voltage VOG applied to the overflow gates OG1 and OG2 may have a turn-off voltage level VOFF that causes draining of the photo charge to be blocked. In addition, during the integration period TINT, the first and second demodulation signals STGA and STGB of different phases may be applied to the first and second demodulation transfer gates TGA and TGB, respectively. The phase of the first demodulation signal STGA may be synchronized with the phase of transmission light TL. In embodiments, the phase difference between the first and second demodulation signals STGA and STGB may be about 180 degrees. A method of measuring distance using the demodulation signals of the different phases will be described below with reference to FIGS. 10 through 12.

During the other periods, for example, a reset period TRST in which the depth pixel PX1 is initialized and a readout period TRD in which an amount of the photo charge collected by the common photogate CPG is measured, the overflow gate voltage VOG may have a turn-on voltage level VON that causes the draining of the photo charge collected by the common photogate CPG. As such, a global shutter function may be implemented by draining the charge during the periods other than the integration period TINT using the overflow gates OG1 and OG2.

In embodiments, as illustrated in FIG. 6, the DC voltage level VDC of the photogate voltage VPG during the reset period TRST and the readout period TRD may be about equal to the DC voltage level VDC during the integration period TINT. The DC voltage level VDC may be a voltage level between a high voltage level VH of the demodulation signals STGA and STGB and a low voltage level VL of the demodulation signals STGA and STGB. In embodiments, as illustrated in FIG. 7, a second DC voltage level VDC' of the photogate voltage VPG during the reset period TRST and the readout period TRD may be different from the first DC voltage level VDC during the integration period TINT. The first DC voltage level VDC during the integration period TINT may be a voltage level between the high voltage level VH and the low voltage level VL of the demodulation signals STGA and STGB. During the reset period TRST and the readout period TRD, the overflow gates OG1 and OG2 are in the turned-on state, and the second DC voltage level VDC' may be determined based on the potential distribution of the channels formed in the semiconductor substrate. Even though FIG. 7 illustrates that the second DC voltage level VDC' is higher than the first DC voltage level VDC, embodiments of the inventive concept are not limited thereto. For example, in an embodiment, the second DC voltage level VDC' may be lower than the first DC voltage level VDC depending on the potential distribution of the channels.

Figure 8:
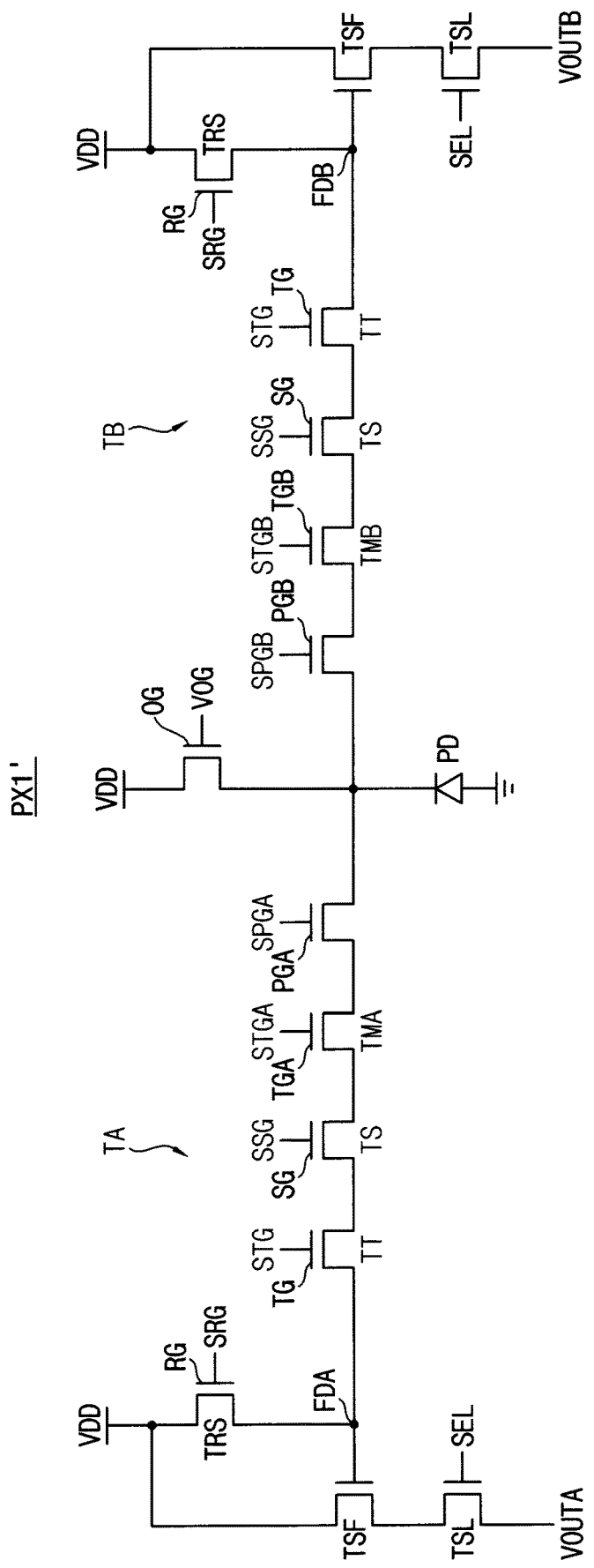
FIG. 8 is a circuit diagram illustrating a depth pixel having a two-tap structure of individual photogates according to a comparative example.
Figure 9:
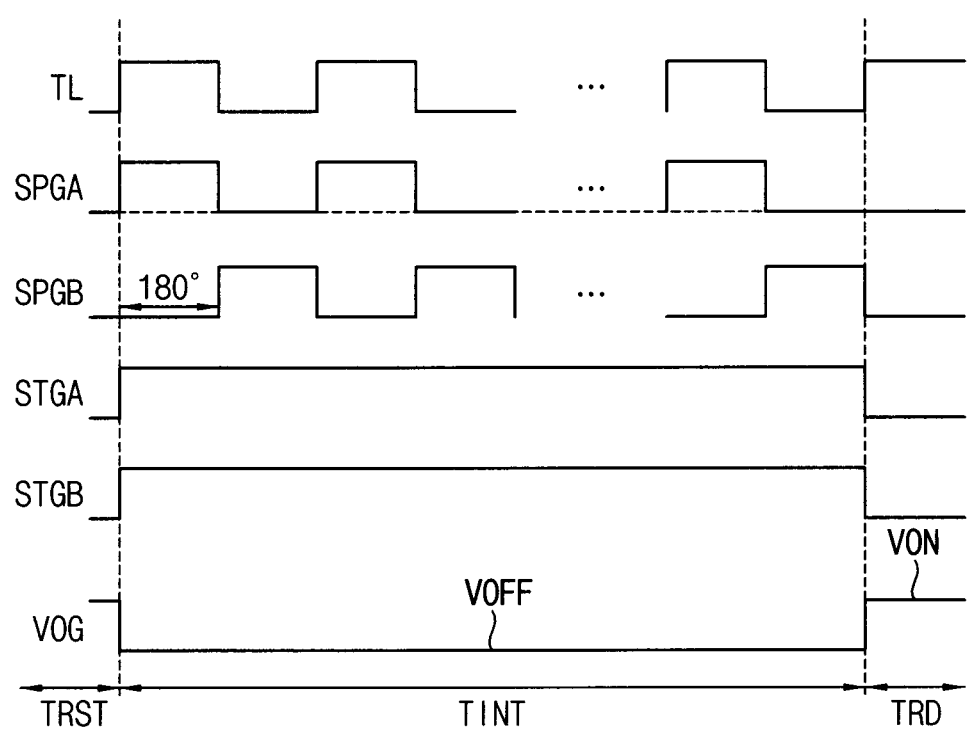
FIG. 9 is a timing diagram illustrating an operation of the depth pixel having the two-tap structure of FIG. 8.

FIG. 8 is a circuit diagram illustrating a depth pixel having a two-tap structure of individual photogates according to a comparative example. FIG. 9 is a timing diagram illustrating an operation of the depth pixel having the two-tap structure of FIG. 8. A depth pixel PX1' of FIG. 8 is similar to the depth pixel PX1 of FIG. 4. Thus, for convenience of explanation, a further description of elements and technical aspects previously described with reference to FIGS. 4 through 7 may be omitted.

Referring to FIG. 8, the depth pixel PX1' may include a first photogate PGA corresponding to the first tap TA and a second photogate PGB corresponding to the second tap TB, which are substituted for the common photo gate CPG of FIGS. 4 and 5.

Referring to FIGS. 8 and 9, a first demodulation signal SPGA and a second demodulation signal SPGB of different phases are applied to the first photogate PGA and the second photogate PGB, respectively, during the integration period TINT. The first transfer control signal STGA and the second transfer control signal STGB applied to the first transfer gate TGA and the second transfer gate TGB have a constant voltage level during the integration period TINT.

As such, the toggling demodulation signals SPGA and SPGB are applied to the individual photogates PGA and PGB corresponding to the taps TA and TB in the depth pixel PX1' of FIG. 8. In general, the photogate has a relatively large size to increase the amount of the collected photo charge. Thus, power consumption may be increased when the toggling demodulation signals SPGA and SPGB are applied to the photogates PGA and PGB of the large size. In contrast, in the depth pixel PX1 of FIGS. 4 and 5 according to embodiments of the inventive concept, the constant DC voltage level VDC is applied to the common photo gate CPG and the toggling demodulation signals STGA and STGB are applied to the demodulation transfer gates TGA and TAB of the relatively small size. Thus, power consumption may be reduced in comparison with the depth pixel PX1' of FIG. 8.

In addition, the number of signal lines of the depth pixel PX1' may be increased depending on the number of taps or the number of the photogates. The increase in the number of signal lines may act as a restriction to the semiconductor manufacturing processes and may limit decreasing the size of the depth pixel. In contrast, referring to the depth pixel PX1 of FIGS. 4 and 5, in embodiments of the inventive concept, one signal line may be utilized to drive the common photo gate CPG regardless of the number of taps, thereby decreasing the size of the depth pixel.

As such, the depth pixel according to embodiments of the inventive concept may decrease the power consumption and the size of a depth pixel by applying the one common photo gate CPG described above.

Figure 10:
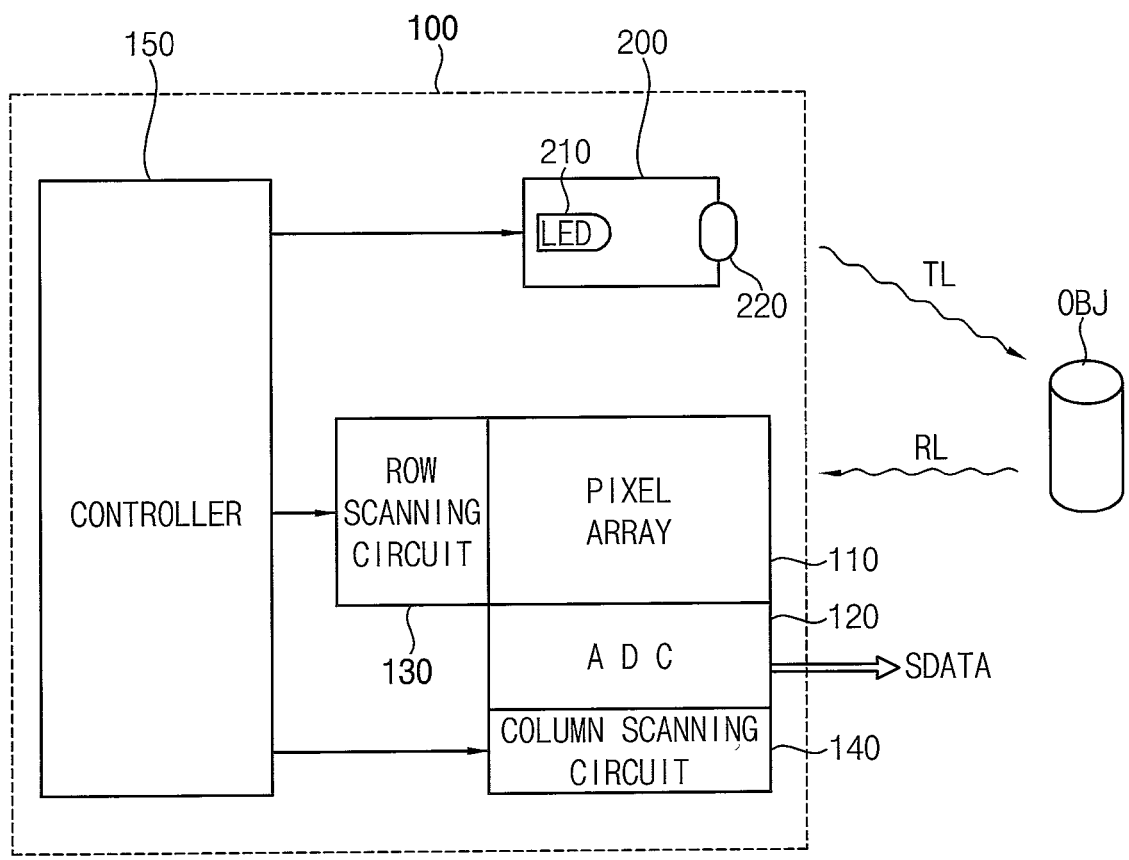
FIG. 10 is a block diagram illustrating a time-of-flight (ToF) sensor according to embodiments of the inventive concept.

FIG. 10 is a block diagram illustrating a time-of-flight (ToF) sensor according to embodiments of the inventive concept.

Referring to FIG. 10, a ToF sensor 100 includes a sensing unit, a controller 150 and a light source module 200. The sensing unit may include a pixel array 110, an analog-to-digital conversion (ADC) unit 120, a row scanning circuit 130, and a column scanning circuit 140.

The pixel array 110 may include depth pixels receiving light RL that is reflected from an object OBJ after being transmitted to the object OBJ by the light source module 200. This reflected light may be referred to as reflection light RL, and the depth pixels may convert the reflection light RL into electrical signals. The depth pixels may provide information about a distance of the object OBJ from the ToF sensor 100 and/or black-and-white image information.

The pixel array 110 may further include color pixels for providing color image information. In this case, the ToF sensor 100 may be a three-dimensional color image sensor that provides the color image information and the depth information. According to embodiments, an infrared filter and/or a near-infrared filter may be formed on the depth pixels, and a color filter (e.g., red, green and blue filters) may be formed on the color pixels. According to embodiments, a ratio of the number of the depth pixels to the number of the color pixels may vary as desired.

The ADC unit 120 may convert an analog signal output from the pixel array 110 into a digital signal. According to embodiments, the ADC unit 120 may perform a column analog-to-digital conversion that converts analog signals in parallel using a plurality of analog-to-digital converters respectively coupled to a plurality of column lines. According to embodiments, the ADC unit 120 may perform a single analog-to-digital conversion that sequentially converts the analog signals using a single analog-to-digital converter.

According to embodiments, the ADC unit 120 may further include a correlated double sampling (CDS) unit for extracting an effective signal component. According to embodiments, the CDS unit may perform an analog double sampling operation that extracts the effective signal component based on a difference between an analog reset signal including a reset component and an analog data signal including a signal component. According to embodiments, the CDS unit may perform a digital double sampling that converts the analog reset signal and the analog data signal into two digital signals and extracts the effective signal component based on a difference between the two digital signals. According to embodiments, the CDS unit may perform a dual correlated double sampling operation that performs both the analog double sampling operation and the digital double sampling operation.

The row scanning circuit 130 may receive control signals from the controller 150, and may control a row address and a row scan of the pixel array 110. To select a row line among a plurality of row lines, the row scanning circuit 130 may apply a signal for activating the selected row line to the pixel array 110. According to embodiments, the row scanning circuit 130 may include a row decoder that selects a row line of the pixel array 110 and a row driver that applies a signal for activating the selected row line.

The column scanning circuit 140 may receive control signals from the controller 150, and may control a column address and a column scan of the pixel array 110. The column scanning circuit 140 may output a digital output signal from the ADC unit 120 to a digital signal processing circuit and/or to an external host. For example, the column scanning circuit 140 may provide the ADC unit 120 with a horizontal scan control signal to sequentially select a plurality of analog-to-digital converters included in the ADC unit 120. According to embodiments, the column scanning circuit 140 may include a column decoder that selects one of the plurality of analog-to-digital converters, and a column driver that applies an output of the selected analog-to-digital converter to a horizontal transmission line. The horizontal transmission line may have a bit width corresponding to that of the digital output signal.

The controller 150 may control the ADC unit 120, the row scanning circuit 130, the column scanning circuit 140, and the light source module 200. The controller 150 may provide the ADC unit 120, the row scanning circuit 130, the column scanning circuit 140, and the light source module 200 with control signals such as, for example, a clock signal, a timing control signal, or the like. According to embodiments, the controller 150 may include a control logic circuit, a phase locked loop circuit, a timing control circuit, a communication interface circuit, or the like.

The light source module 200 may emit light of a desired (or alternatively predetermined) wavelength. For example, the light source module 200 may emit infrared light and/or near-infrared light. The light source module 200 may include a light source 210 and a lens 220. The light source 210 may be controlled by the controller 150 to emit the transmission light TL of a desired intensity and/or characteristic (for example, periodic). For example, the intensity and/or characteristic of the transmission light TL may be controlled such that the transmission light TL has a waveform of, for example, a pulse wave, a sine wave, a cosine wave, or the like. The light source 210 may be implemented by, for example, a light emitting diode (LED), a laser diode, or the like.

Hereinafter, a normal operation of the ToF sensor 100 according to embodiments will be described below.

The controller 150 may control the light source module 200 to emit the transmission light TL having the periodic intensity. The transmission light TL emitted by the light source module 200 may be reflected from the object OBJ back to the ToF sensor 100 as the reflection light RL. The reflection light RL may be incident on the depth pixels, and the depth pixels may be activated by the row scanning circuit 130 to output analog signals corresponding to the reflection light RL. The ADC unit 120 may convert the analog signals output from the depth pixels into sample data SDATA. The sample data SDATA may be provided to the controller 150 by the column scanning circuit 140 and/or the ADC 120.

The controller 150 may calculate a distance of the object OBJ from the ToF sensor 100, a horizontal position of the object OBJ, a vertical position of the object OBJ and/or a size of the object OBJ based on the sample data SDATA. The controller 150 may control the emission angle or a projection (or incident) region of the transmission light TL based on the distance, the horizontal position, the vertical position and/or the size of the object OBJ. For example, the controller 150 may control an interval between the light source 210 and the lens 220, a relative position (or a placement) of the light source 210 and the lens 220 with respect to each other, a refractive index of the lens 220, a curvature of the lens 220, or the like.

The transmission light TL illuminating the object OBJ may be reflected and the reflection light RL may be incident on the depth pixels in the pixel array 110. The depth pixels may output analog signals corresponding to the reflection light RL, and the ADC unit 120 may convert the analog signals to digital data or the sample data SDATA. The sample data SDATA and/or the depth information may be provided to the controller 150, the digital signal processing circuit and/or the external host. According to embodiments, the pixel array 110 may include color pixels, and the color image information as well as the depth information may be provided to the digital signal processing circuit and/or the external host.

Figure 11:
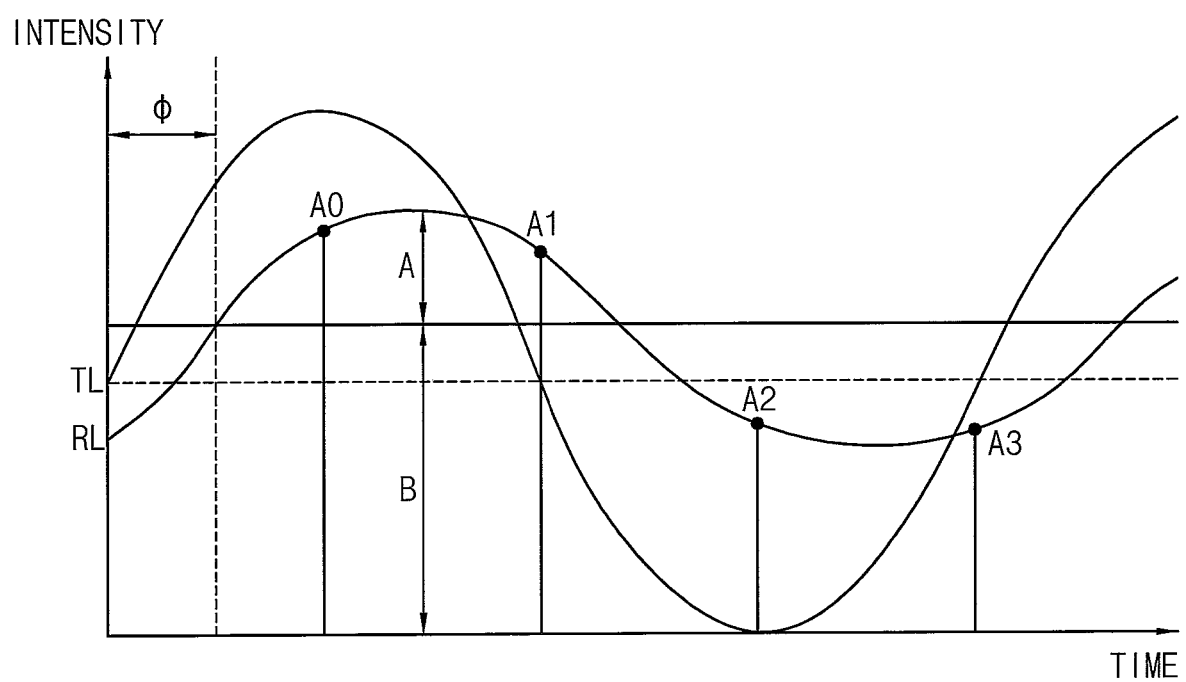
FIGS. 11 and 12 are diagrams for describing an example of a method of measuring and calculating a distance to an object.
Figure 12:
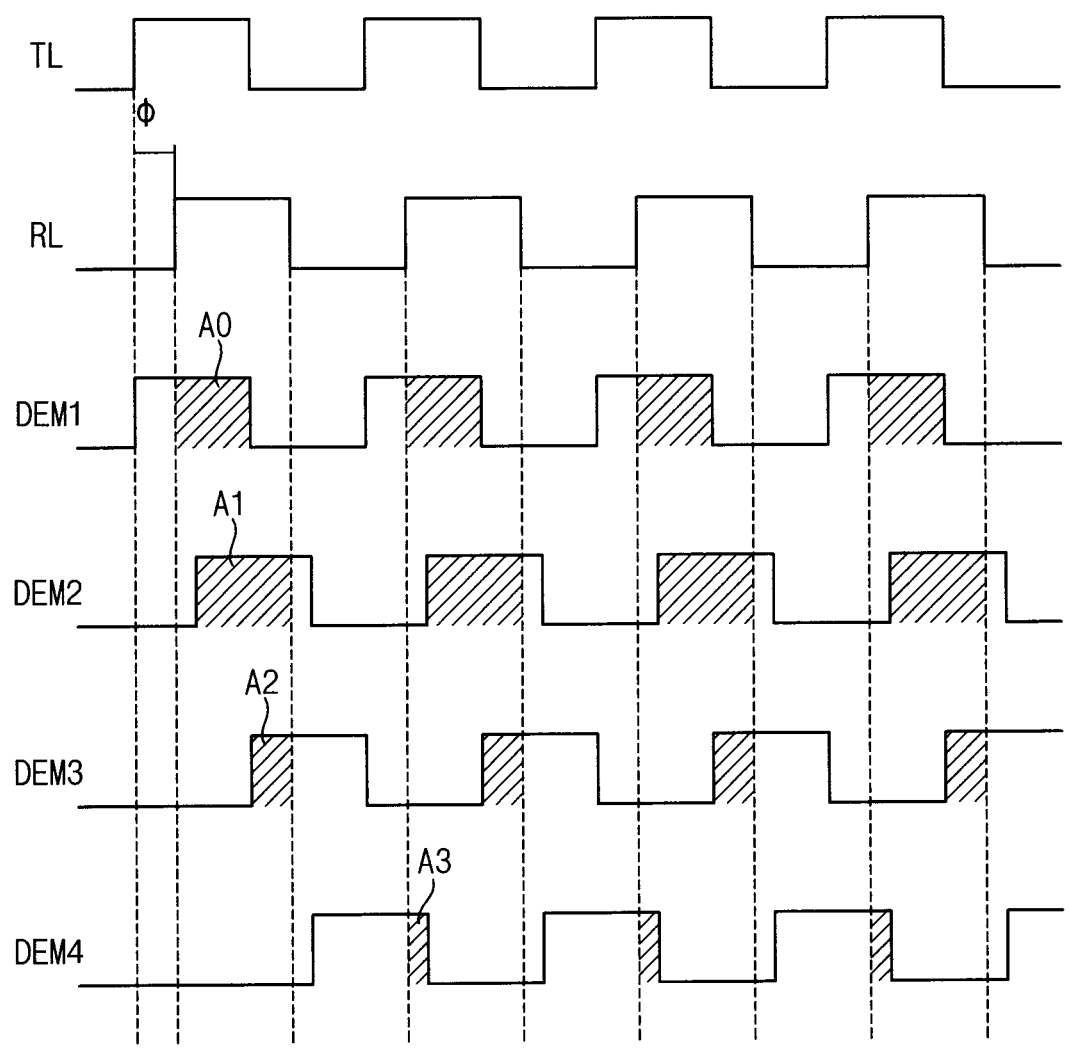

FIGS. 11 and 12 are diagrams for describing an example of a method of measuring and calculating a distance to an object.

Referring to FIGS. 10 and 11, the transmission light TL emitted by the light source module 200 may have a periodic intensity and/or characteristic. For example, the intensity (e.g., the number of photons per unit area) of the transmission light TL may have a waveform of a sine wave.

The transmission light TL emitted by the light source module 200 may be reflected from the object OBJ, and then may be incident on the pixel array 110 as reflection light RL. The pixel array 110 may periodically sample the reflection light RL. According to embodiments, during each period of the reflection light RL (for example, corresponding to a period of the transmission light TL), the pixel array 110 may perform a sampling operation on the reflection light RL by sampling, for example, at two sampling points having a phase difference of about 180 degrees, at four sampling points having a phase difference of about 90 degrees, or at more than four sampling points. For example, the pixel array 110 may extract four samples A0, A1, A2 and A3 of the reflection light RL at phases of about 90 degrees, about 180 degrees, about 270 degrees and about 360 degrees per period, respectively.

The reflection light RL may have an offset B that is different from an offset of the transmission light TL emitted by the light source module 200 due to, for example, background light, noise, or the like. The offset B of the reflection light RL may be calculated by Equation 1.

$$B = \frac{A0 + A1 + A2 + A3}{4} \quad \text{[Equation 1]}$$

Here, A0 represents an intensity of the reflection light RL sampled at a phase of about 90 degrees of the emitted transmission light TL, A1 represents an intensity of the reflection light RL sampled at a phase of about 180 degrees of the emitted transmission light TL, A2 represents an intensity of the reflection light RL sampled at a phase of about 270 degrees of the emitted transmission light TL, and A3 represents an intensity of the reflection light RL sampled at a phase of about 360 degrees of the emitted transmission light TL.

The reflection light RL may have an amplitude A lower than that of the transmission light TL emitted by the light source module 200 due to loss (e.g., light loss). The amplitude A of the reflection light RL may be calculated by Equation 2.

$$A = \frac{\sqrt{(A0 - A2)^2 + (A1 - A3)^2}}{2} \quad \text{[Equation 2]}$$

Black-and-white image information about the object OBJ may be provided by respective depth pixels included in the pixel array 110 based on the amplitude A of the reflection light RL.

The reflection light RL may be delayed by a phase difference Φ corresponding to, for example, a double of the distance of the object OBJ from the ToF sensor 100 with respect to the emitted transmission light TL. The phase difference Φ between the emitted transmission light TL and the reflection light RL may be calculated by Equation 3.

$$\phi = \arctan\left(\frac{A0 - A2}{A1 - A3}\right) \quad \text{[Equation 3]}$$

The phase difference Φ between the emitted transmission light TL and the reflection light RL may, for example, correspond to a time-of-flight (TOF). The distance of the object OBJ from the ToF sensor 100 may be calculated by an equation, "R=c*TOF/2", where R represents the distance of the object OBJ, and c represents the speed of light. Further, the distance of the object OBJ from the ToF sensor 100 may also be calculated by Equation 4 using the phase difference Φ between the emitted transmission light TL and the reflection light RL.

$$R = \frac{c}{4\pi f}\phi \quad \text{[Equation 4]}$$

Here, f represents a modulation frequency, which is a frequency of the intensity of the emitted transmission light TL (or a frequency of the intensity of the reflection light RL).

As described above, the ToF sensor 100 according to embodiments may obtain depth information about the object OBJ using the transmission light TL emitted by the light source module 200. Although FIG. 5 illustrates the transmission light TL of which the intensity has a waveform of a sine wave, embodiments of the inventive concept are not limited thereto. For example, in embodiments, the ToF sensor 100 may use the transmission light TL of which the intensity has various types of waveforms. Further, the ToF sensor 100 may extract the depth information according to, for example, the waveform of the intensity of the transmission light TL, a structure of a depth pixel, or the like.

FIG. 12 illustrates an example of modulation timing and demodulation timings of a depth pixel having a four-tap structure. The operation of the ToF sensor may be modified variously.

Referring to FIG. 12, the transmission light TL from the light source may be output in synchronization with a signal provided from the controller 150. The first through fourth demodulation signals DEM1 through DEM4 may be generated in synchronization with the signal from the controller 150. The first through fourth demodulation signals DEM1 through DEM4 have phase differences of about 0, 90, 180 and 270 degrees. As described above with reference to FIG. 11, four samples A0, A1, A2 and A3 of the reflection light RL may be sampled at phases of about 90 degrees, about 180 degrees, about 270 degrees and about 360 degrees per period, respectively.

FIG. 12 illustrates an example in which the phase of the first demodulation signal DEM1 coincides with the phase of the transmission light TL. The first through fourth demodulation signals DEM1 through DEM4 may be applied to first through fourth demodulation transfer gates, respectively, as will be described below.

FIGS. 11 and 12 are provided for describing the principal of measuring and calculating a distance to an object using a ToF sensor, and embodiments of the inventive concept are not limited thereto. For example, the duty ratio of the transmission light TL and the number, the phase differences and the duty ratio of the demodulation signals, may be changed variously.

Figure 13:
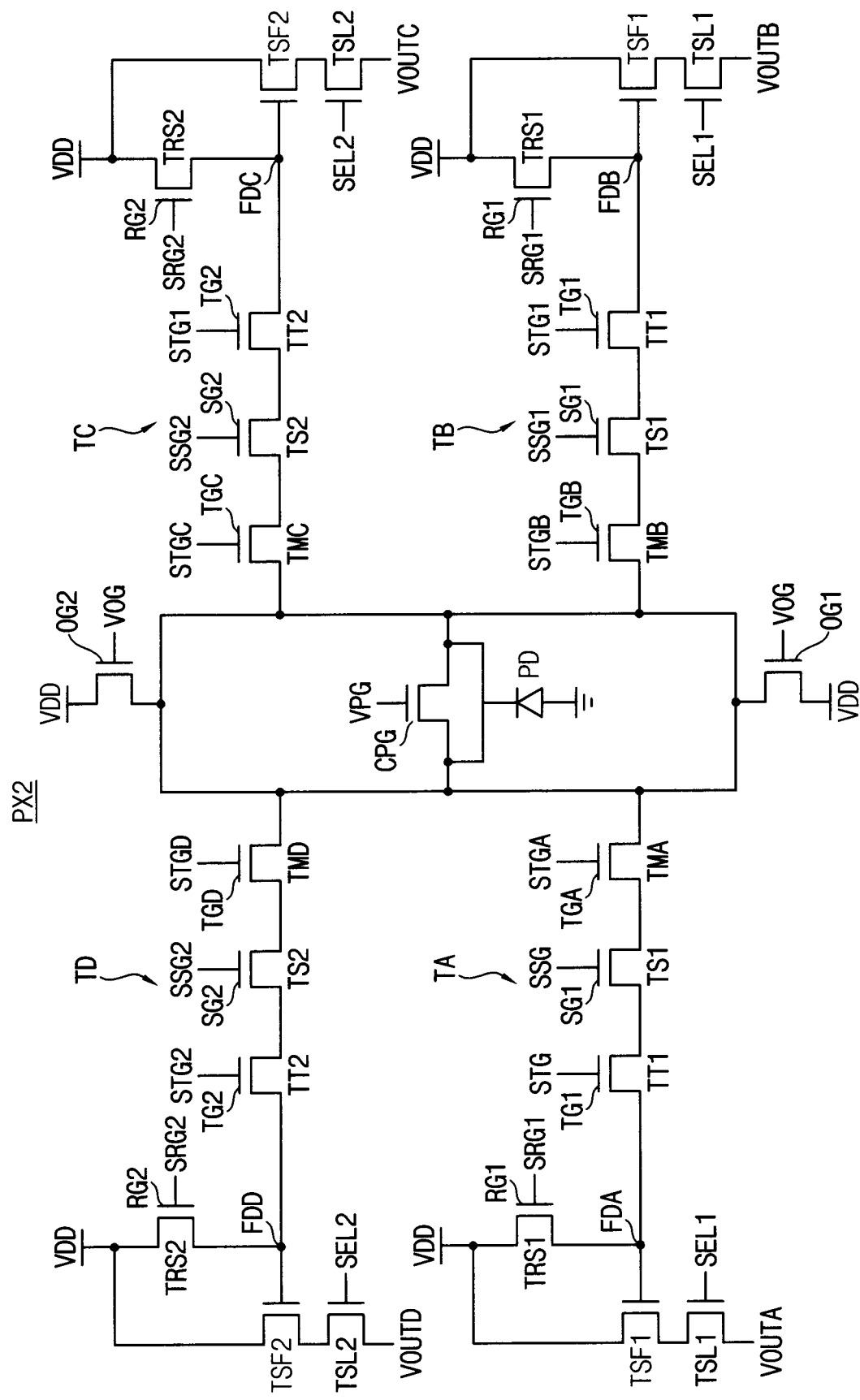
FIG. 13 is a circuit diagram illustrating a depth pixel having a four-tap structure according to embodiments of the inventive concept.
Figure 14:
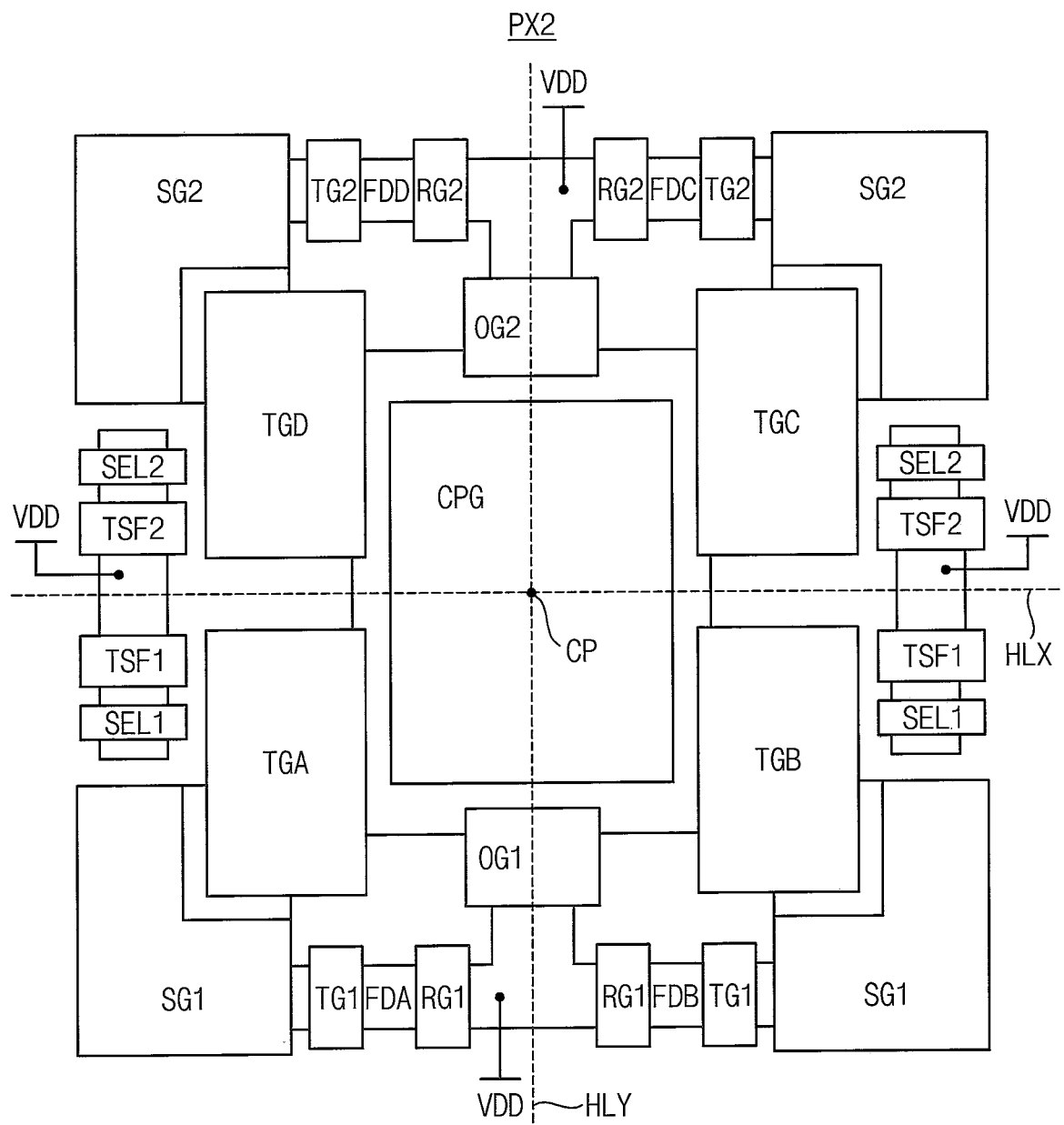
FIG. 14 is a diagram illustrating an example of a layout of the depth pixel having the four-tap structure of FIG. 13 according to embodiments of the inventive concept.

FIG. 13 is a circuit diagram illustrating a depth pixel having a four-tap structure according to embodiments of the inventive concept. FIG. 14 is a diagram illustrating an example of a layout of the depth pixel having the four-tap structure of FIG. 13 according to embodiments of the inventive concept.

Referring to FIGS. 13 and 14, a depth pixel PX2 may include transistors TMA, TS1 and TT1 corresponding to a first tap TA, transistors TMB, TS1 and TT1 corresponding to a second tap TB, transistors TMC, TS2 and TT2 corresponding to a third tap TC, transistors TMD, TS2 and TT2 corresponding to a fourth tap TD, transistors TRS1, TRS2, TSF1, TSF2, TSL1 and TSL2 corresponding to a readout circuit, and a common photo gate CPG, overflow gates OG1 and OG2 and a photodiode PD corresponding to a shared circuit.

Each of the transistors TMA, TMB, TMC, TMD, TS1, TS2, TT1, TT2, TRS1 and TRS2 may include a gate disposed above a semiconductor substrate and source and drain regions disposed at both sides of the gate in the semiconductor substrate. The gates of the transistors TMA, TMB, TMC, TMD, TS1, TS2, TT1, TT2, and TRS1 correspond to a first demodulation transfer gate TGA, a second demodulation transfer gate TGB, a third demodulation transfer gate TGC, a fourth demodulation transfer gate TGD, storage gates SG1 and SG2, FD transfer gates TG1 and TG2, and reset gates RG1 and RG2, respectively.

A photogate voltage VPG is applied to the common photo gate CPG, an overflow gate voltage VOG is applied to the overflow gates OG1 and OG2, a storage control signal SSG is applied to the storage gates SG1 and SG2, an FD transfer control signal STG is applied to the FD transfer gates TG1 and TG2, reset signals SRG1 and SRG2 are applied to the reset gates RG1 and RG2, respectively, and selection signals SEL1 and SEL2 are applied to the gate of the selection transistors TSL1 and TSL2, respectively. First through fourth demodulation signal STGA, STGB, STGC and STGD having different phases are applied to the first through fourth demodulation transfer gates TGA, TGB, TGC and TGD, respectively.

The photogate voltage VPG, the overflow gate voltage VOG, the storage control signal SSG, the FD transfer control signal STG, the reset signals SRG1 and SRG2, the selection signals SEL1 and SEL2, and the demodulation signals STGA, STGB, STGC and STGD may be provided from the row scanning circuit 130 under control of the controller 150, as described with reference to FIG. 10.

The storage gates SG1 and SG2 are one of charge storing structures to temporarily store the photo charge transferred from the common photogate CPG before transferring the photo charge to the floating diffusion regions FDA, FDB, FDC and FDD. In embodiments, the charge storing structure may be implemented with the storage gates SG1 and SG2 alone. In embodiments, the charge storing structure may be implemented with the storage gates SG1 and SG2 and storage diodes formed in the semiconductor substrate under the storage gates SG1 and SG2. Using such a charge storing structure, true correlated double sampling (CDS) may be performed and noise in the readout signals may be reduced. According to embodiments, the FD transfer gates TG1 and TG2 and/or the storage gates SG1 and SG2 may be omitted.

The charge stored in the floating diffusion regions FDA, FDB, FDC and FDD may be provided as output signal VOUTA, VOUTB, VOUTC and VOUTD using the source follower transistors TSF1 and TSF2 and the selection transistors TSL1 and TSL2.

As illustrated in FIG. 14, the one common photo gate CPG may be disposed in the center region of the depth pixel PX2 and the demodulation transfer gates TGA, TGB, TGC and TGD and the overflow gates OG1 and OG2 may form a symmetric structure with respect to the common photo gate CPG. The demodulation transfer gates TGA, TGB, TGC and TGD may be symmetric with respect to each of the horizontal line HLX and the vertical line HLY, that is, symmetric with respect to the center CP of the depth pixel PX2. In addition, the overflow gates OG1 and OG2 may be symmetric with respect to each of the horizontal line HLX and the vertical line HLY, that is, symmetric with respect to the center CP of the depth pixel PX2. Through such a symmetric structure, deviations of operational characteristics of the taps TA and TB may be reduced and the sensing accuracy of the depth pixel PX1 may be increased.

Figure 15:
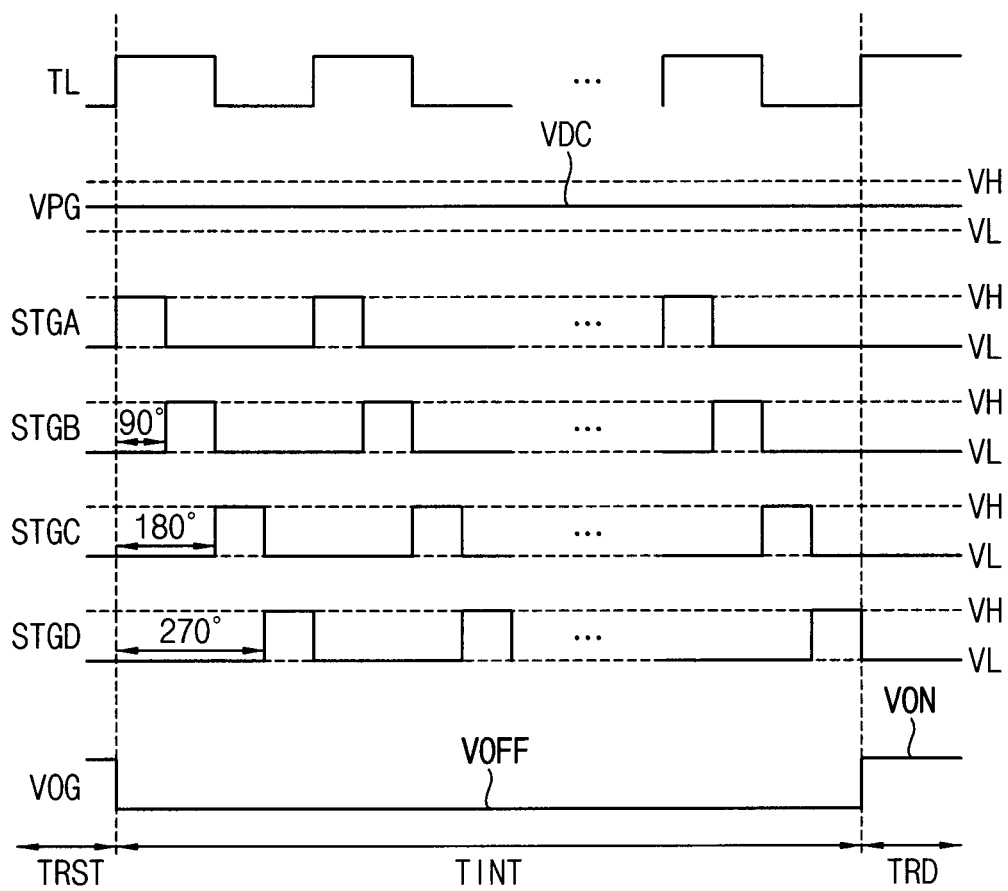
FIG. 15 is a timing diagram illustrating an example of an operation of the depth pixel having the four-tap structure of FIG. 13 according to embodiments of the inventive concept.

FIG. 15 is a timing diagram illustrating an example of an operation of the depth pixel having the four-tap structure of FIG. 13 according to embodiments of the inventive concept.

Referring to FIGS. 13 through 15, during the integration period TINT, the photogate voltage VPG applied to the common photogate CPG may have a DC voltage level VDC that causes collecting the photo charge, and the overflow gate voltage VOG applied to the overflow gates OG1 and OG2 may have a turn-off voltage level VOFF that causes draining of the photo charge to be blocked. In addition, during the integration period TINT, the first through fourth demodulation signals STGA, STGB, STGC and STGD of different phases may be applied to the first through fourth demodulation transfer gates TGA, TGB, TGC and TGD, respectively. The phase of the first demodulation signal STGA may be synchronized with the phase of the transmission light TL. In embodiments, the phase difference between the first and second demodulation signals STGA and STGB may be about 90 degrees, the phase difference between the first and third demodulation signals STGA and STGC may be about 180 degrees, and the phase difference between the first and fourth demodulation signals STGA and STGD may be about 270 degrees. The method of measuring distance using the demodulation signals of the different phases may be the same as described with reference to FIGS. 10 through 12.

During the other periods, for example, a reset period TRST in which the depth pixel PX1 is initiated and a readout period TRD in which an amount of the photo charge collected by the common photogate CPG is measured, the overflow gate voltage VOG may have a turn-on voltage level VON that causes the photo charge collected by the common photogate CPG to be drained. As such, a global shutter function may be implemented by draining the charge during the periods other than the integration period TINT using the overflow gates OG1 and OG2.

In embodiments, as illustrated in FIG. 15, the DC voltage level VDC of the photogate voltage VPG during the reset period TRST and the readout period TRD may be about equal to the DC voltage level VDC during the integration period TINT. The DC voltage level VDC may be a voltage level between a high voltage level VH of the demodulation signals STGA and STGB and a low voltage level VL of the demodulation signals STAG and STGB. In embodiments, as described with reference to FIG. 7, the second DC voltage level VDC' of the photogate voltage VPG during the reset period TRST and the readout period TRD may be different from the first DC voltage level VDC during the integration period TINT. The first DC voltage level VDC during the integration period TINT may be a voltage level between the high voltage level VH and the low voltage level BL of the demodulation signals STGA and STGB. During the reset period TRST and the readout period TRD, the overflow gates OG1 and OG2 are in the turned-on state, and the second DC voltage level VDC' may be determined based on the potential distribution of the channels formed in the semiconductor substrate. Even though FIG. 7 illustrates that the second DC voltage level VDC' is higher than the first DC voltage level VDC, embodiments of the inventive concept are not limited thereto. For example, in embodiments, the second DC voltage level VDC' may be lower than the first DC voltage level VDC depending on the potential distribution of the channels.

Figure 16:
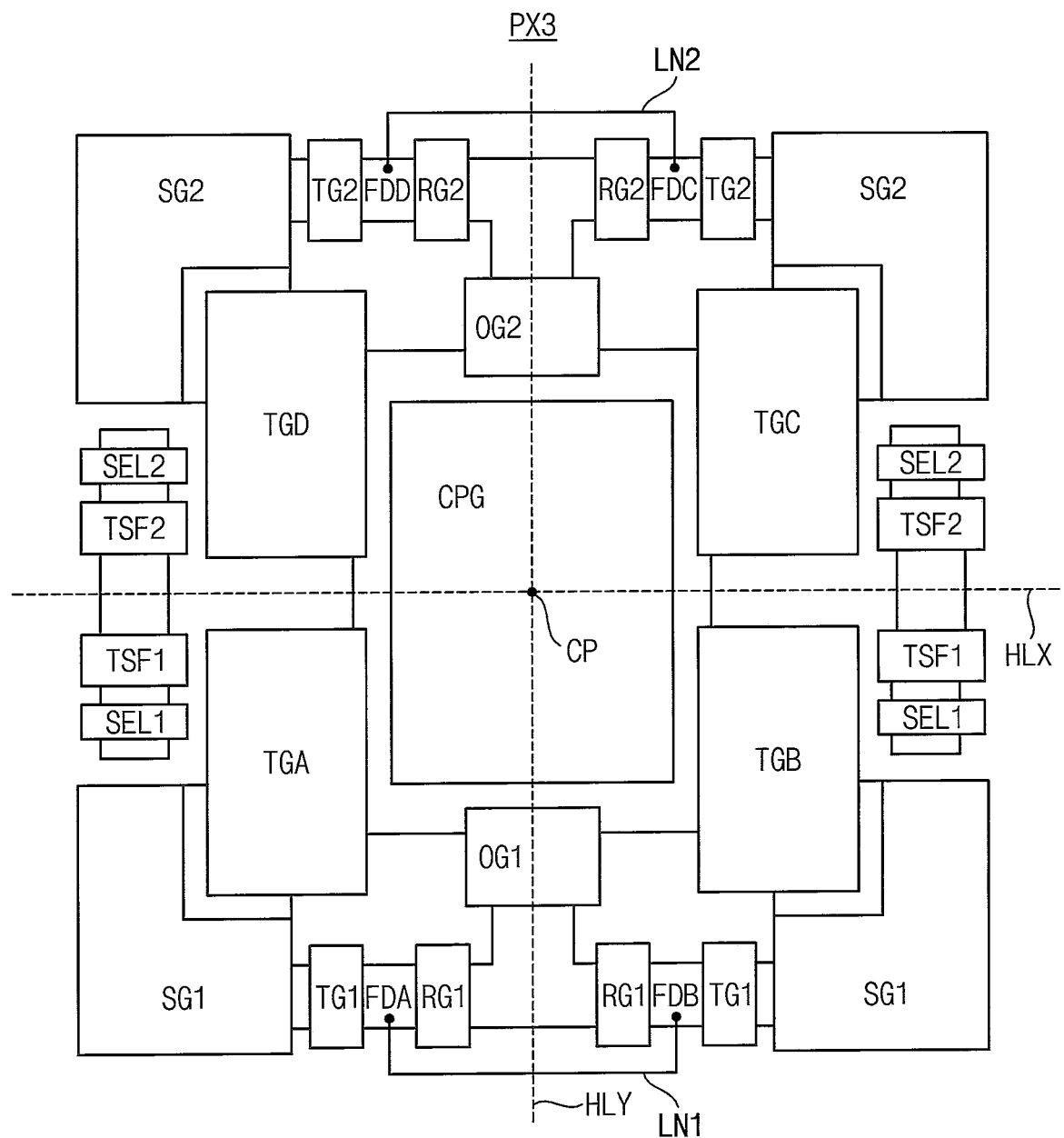
FIGS. 16 and 17 are diagrams illustrating examples of a structure sharing a floating diffusion region of a depth pixel according to embodiments of the inventive concept.
Figure 17:
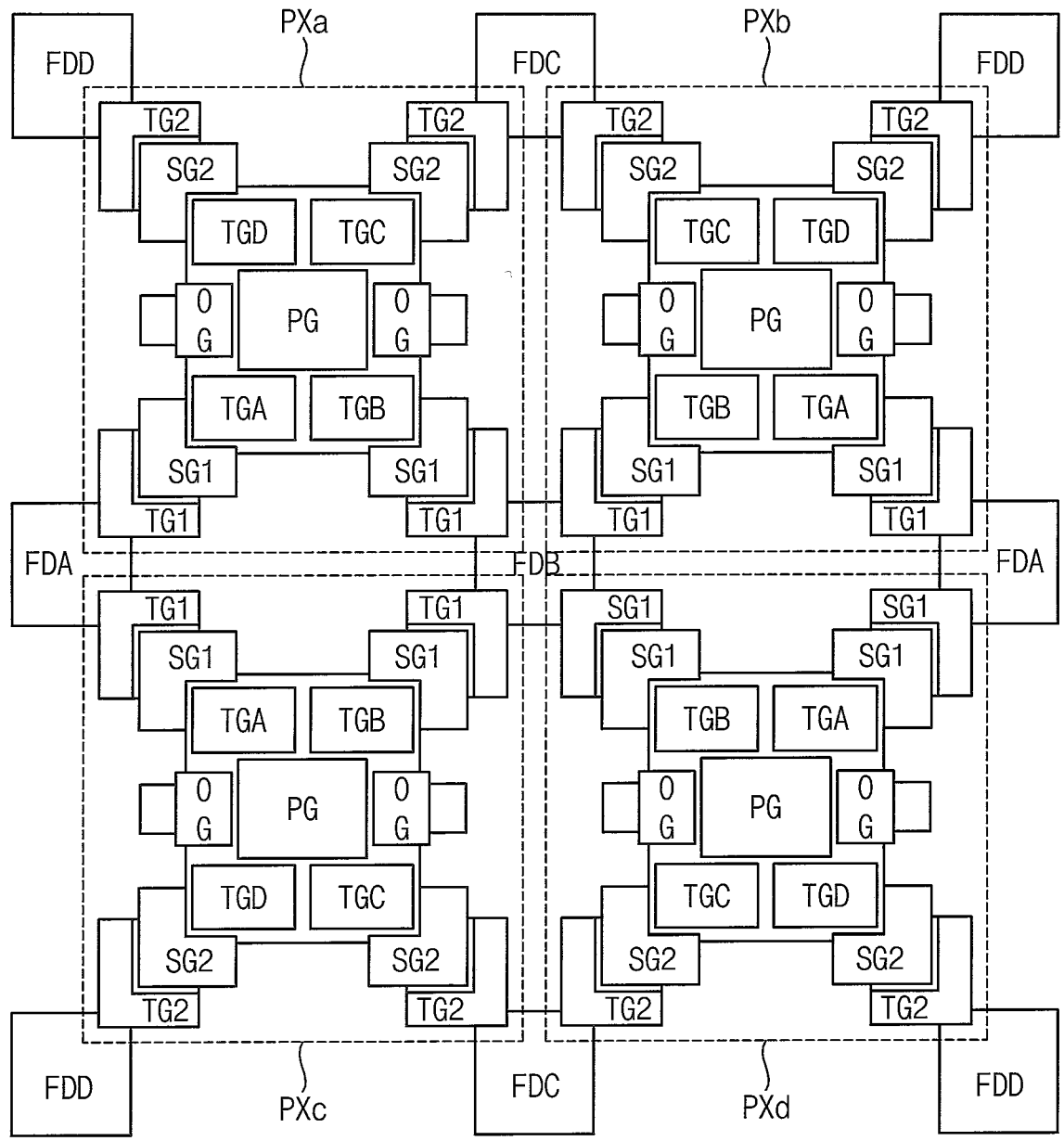

FIGS. 16 and 17 are diagrams illustrating examples of a structure sharing a floating diffusion region of a depth pixel according to embodiments of the inventive concept.

A depth pixel PX3 of FIG. 16 is substantially the same as the depth pixel PX2 of FIGS. 13 and 14 having the four-tap structure except for a portion of the layout. For convenience of explanation, a further description of elements and technical aspects previously described may be omitted.

In the depth pixel PX3, the one common photo gate CPG may be disposed in the center region, and the demodulation transfer gates TGA, TGB, TGC and TGD and the overflow gates OG1 and OG2 may form a symmetric structure with respect to the common photo gate CPG. The demodulation transfer gates TGA, TGB, TGC and TGD may be symmetric with respect to each of the horizontal line HLX and the vertical line HLY. In other words, the first and third demodulation transfer gates TGA and TGC may be symmetric with respect to the center CP of the depth pixel PX3, and also the second and fourth demodulation transfer gates TGB and TGD may be symmetric with respect to the center CP of the depth pixel PX3. In addition, the overflow gates OG1 and OG2 may be symmetric with respect to each of the horizontal line HLX and the vertical line HLY, that is, symmetric with respect to the center CP of the depth pixel PX3. Through such a symmetric structure, deviations of operational characteristics of the taps TA and TB may be reduced and the sensing accuracy of the depth pixel PX1 may be increased.

As illustrated in FIG. 16, the first floating diffusion region FDA corresponding to the first tap TA and the second floating diffusion region FDB corresponding to the second tap TB may be electrically connected to each other through a conduction path LN1, and the third floating diffusion region FDC corresponding to the third tap TC and the fourth floating diffusion region FDD corresponding to the fourth tap TD may be electrically connected to each other through a conduction path LN2. The conductions paths LN1 and LN2 may include conduction lines above the semiconductor substrate and vertical contacts such as vias.

In the case of the depth pixel PX3, a demodulation signal having a first phase may be applied to the first and second demodulation transfer gates TGA and TGB, and a demodulation signal having a second phase different from the first phase may be applied to the third and fourth demodulation transfer gates TGC and TGD. As such, the sensing sensitivity of the depth pixel may be increased by electrically connecting at least two floating diffusion regions among a plurality of floating diffusion regions included in each depth pixel.

FIG. 17 illustrates four depth pixels PXa, PXb, PXc and PXd, which are adjacent in the horizontal direction HLX and the vertical direction HLY. Although FIG. 17 illustrates four depth pixels for convenience of illustration, more pixels may be arranged repeatedly in the pixel array 110 in FIG. 10 according to embodiments of the inventive concept.

Referring to FIG. 17, the four adjacent pixels PXa, PXb, PXc and PXd may share one floating diffusion region. For example, the second demodulation signal may be applied commonly to the four taps, which are adjacent to the floating diffusion region FDB and respectively included in the four adjacent pixels PXa, PXb, PXc and PXd, and the photo charge collected by the four adjacent pixels PXa, PXb, PXc and PXd may be summed into the centered floating diffusion region FDB. In this way, the photo charge collected by every four adjacent depth pixels may be summed into the floating diffusion regions FDA, FDB, FDC and FDD, respectively, depending on the phases of the demodulation signals. As such, the sensing sensitivity of the ToF sensor may be increased through the structure sharing the floating diffusion region.

FIGS. 18A, 18B, 18C, 19A, 19B and 19C are diagrams illustrating examples of a layout of a depth pixel according to embodiments of the inventive concept.

Figure 18A:
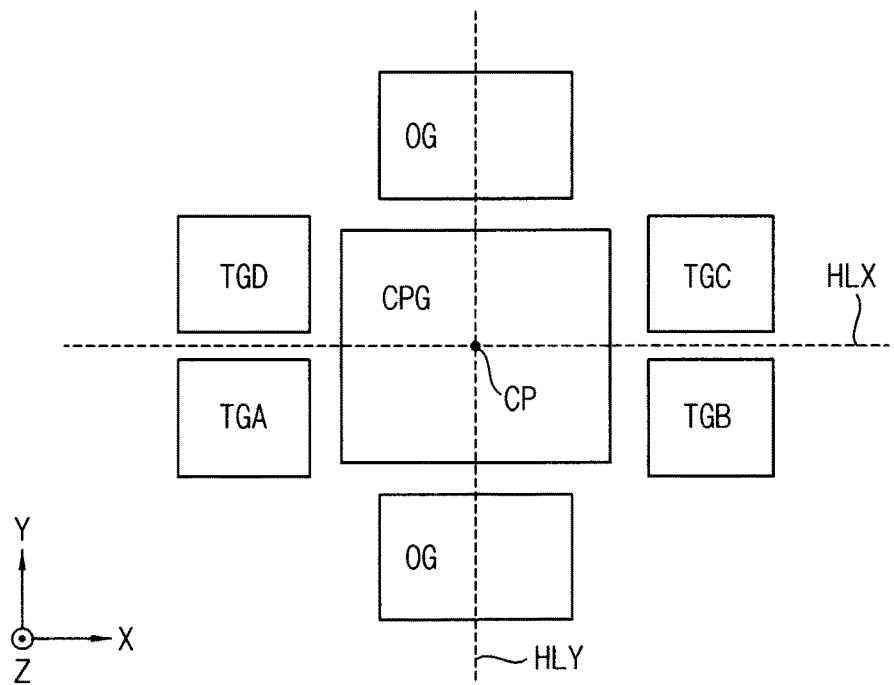
FIGS. 18A, 18B, 18C, 19A, 19B and 19C are diagrams illustrating examples of a layout of a depth pixel according to embodiments of the inventive concept.
Figure 18B:
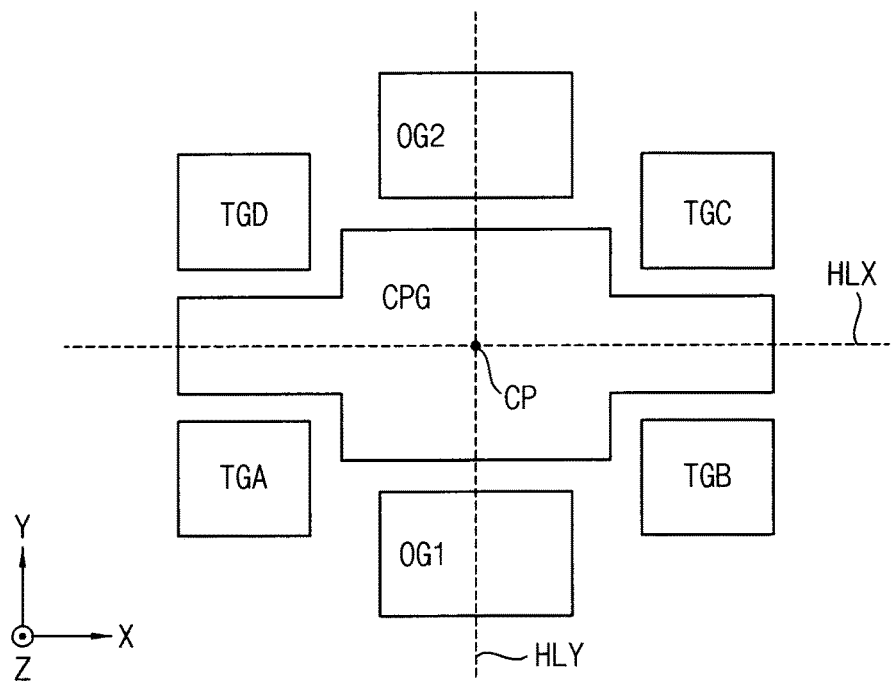
Figure 18C:
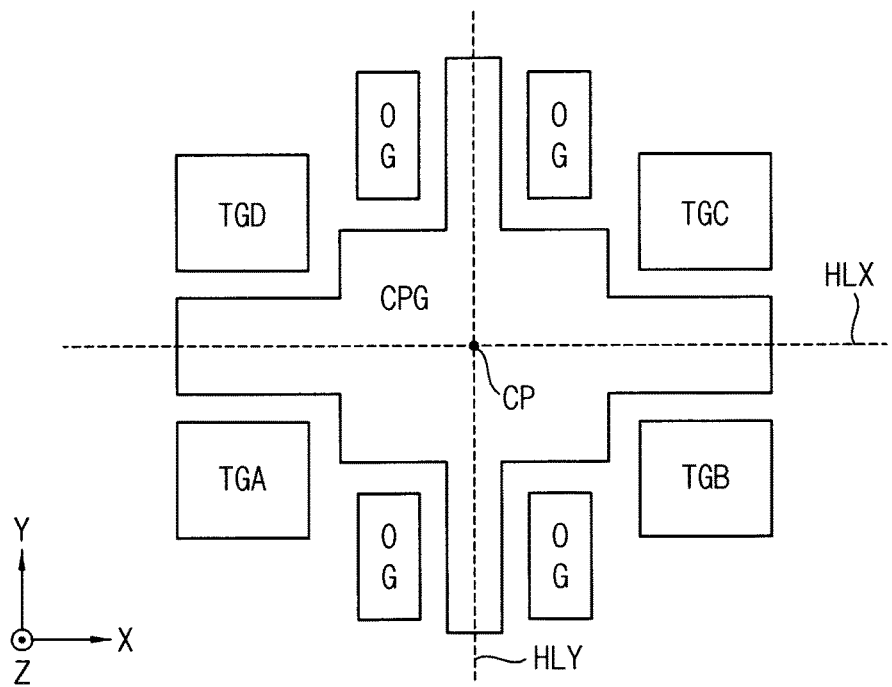

Referring to FIGS. 18A, 18B and 18C, each of depth pixels PX4, PX5 and PX6 having a four-tap structure may include a common photo gate CPG, first through fourth demodulation transfer gates TGA, TGB, TGC and TGD corresponding to first through fourth taps, and overflow gates OG. For convenience of illustration, a further description of elements and technical aspects previously described may be omitted.

The first through fourth demodulation transfer gates TGA, TGB, TGC and TGD may be symmetric with respect to each of the horizontal and vertical lines HLX and HLY passing through the center CP of each depth pixel. In addition, the overflow gates OG may be symmetric with respect to each of the horizontal and vertical lines HLX and HLY. Through such a symmetric structure, deviations of operational characteristics of the first through fourth taps may be reduced and the sensing accuracy of the depth pixels PX4, PX5 and PX6 may be increased.

As illustrated in FIGS. 18A, 18B and 18C, the shape of the common photo gate CPG may be variously determined. According to the shape of the common photo gate CPG, the first through fourth demodulation transfer gates TGA, TGB, TGC and TGD and the overflow gates OG may be disposed in an arrangement to have the symmetric structure.

Figure 19A:
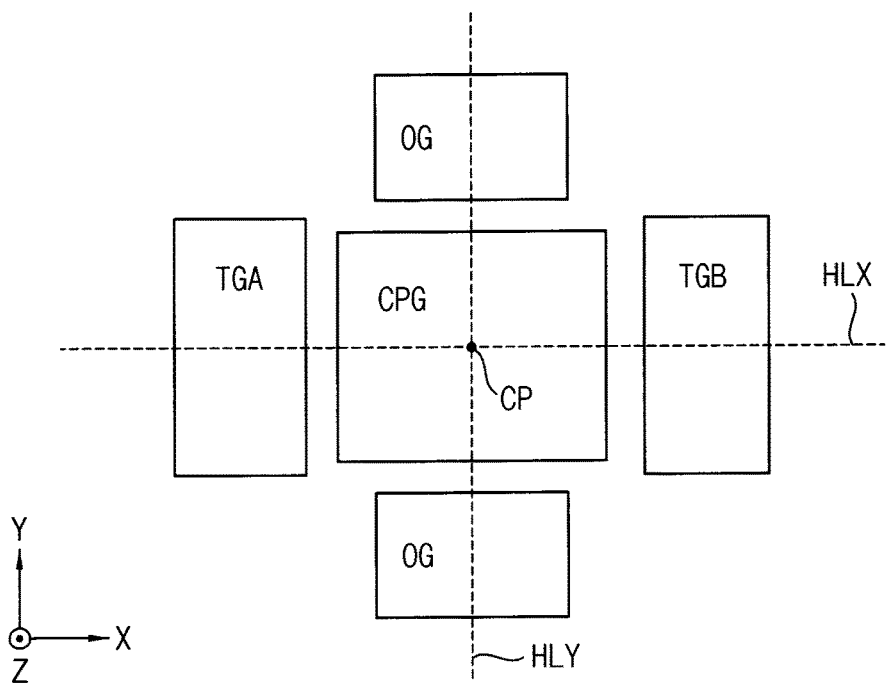
Figure 19B:
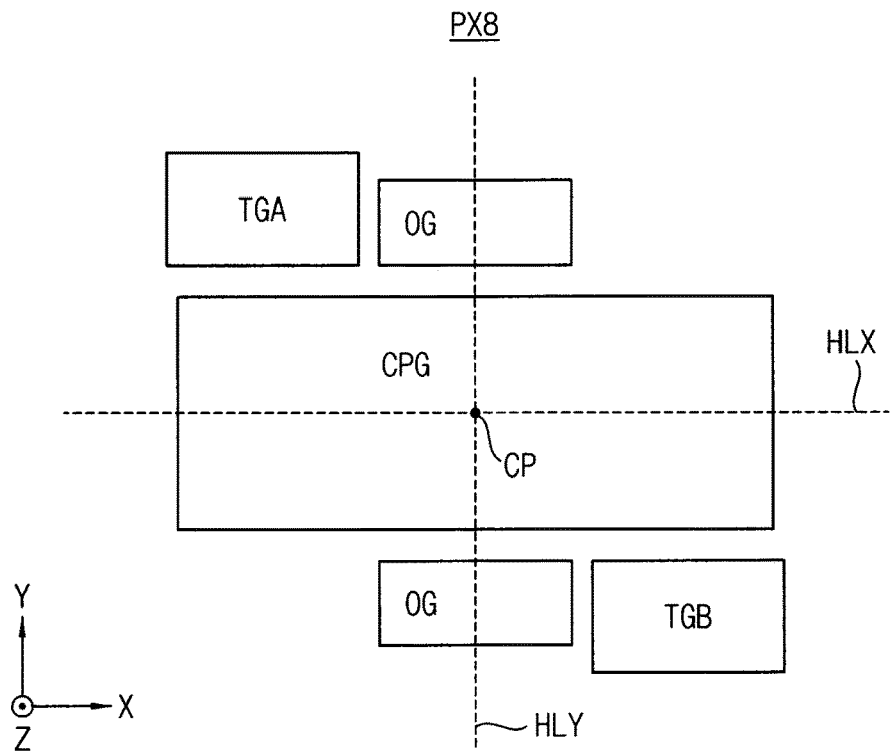
Figure 19C:
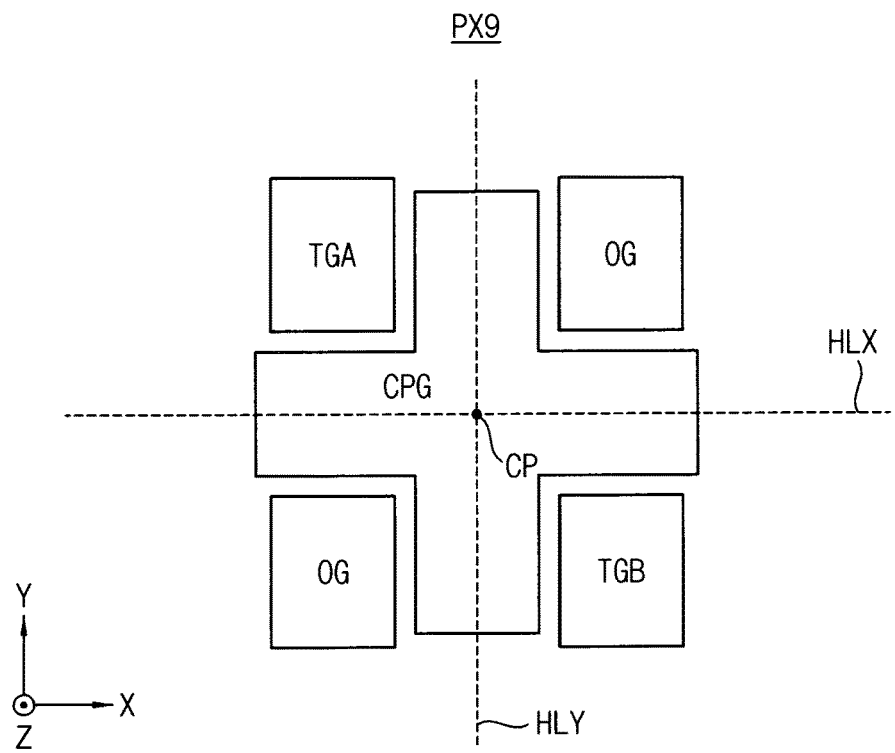

Referring to FIGS. 19A, 19B and 19C, each of depth pixels PX7, PX8 and PX9 having a two-tap structure may include a common photo gate CPG, first and second transfer gates TGA and TGB corresponding to first and second taps, and overflow gates OG. For convenience of explanation, a further description of elements and technical aspects previously described may be omitted.

The first and second demodulation transfer gates TGA and TGB may be symmetric with respect to each of the horizontal and vertical lines HLX and HLY passing through the center CP of each depth pixel, or symmetric with respect to the center CP. In addition, the overflow gates OG may be symmetric with respect to each of the horizontal and vertical lines HLX and HLY. Through such a symmetric structure, deviations of operational characteristics of the first through fourth taps may be reduced and the sensing accuracy of the depth pixels PX7, PX8 and PX9 may be increased.

As illustrated in FIGS. 19A, 19B and 19C, the shape of the common photo gate CPG may be variously determined. According to the shape of the common photo gate CPG, the first and second demodulation transfer gates TGA and TGB and the overflow gates OG may be disposed in an arrangement to have the symmetric structure.

Figure 20:
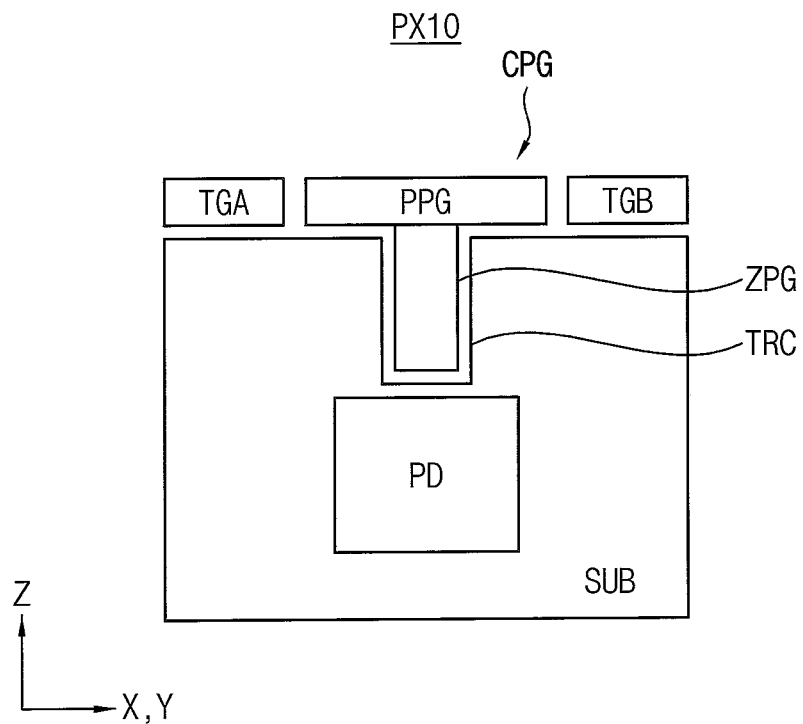
FIG. 20 is a cross-sectional view illustrating a depth pixel according to embodiments of the inventive concept.
Figure 21A:
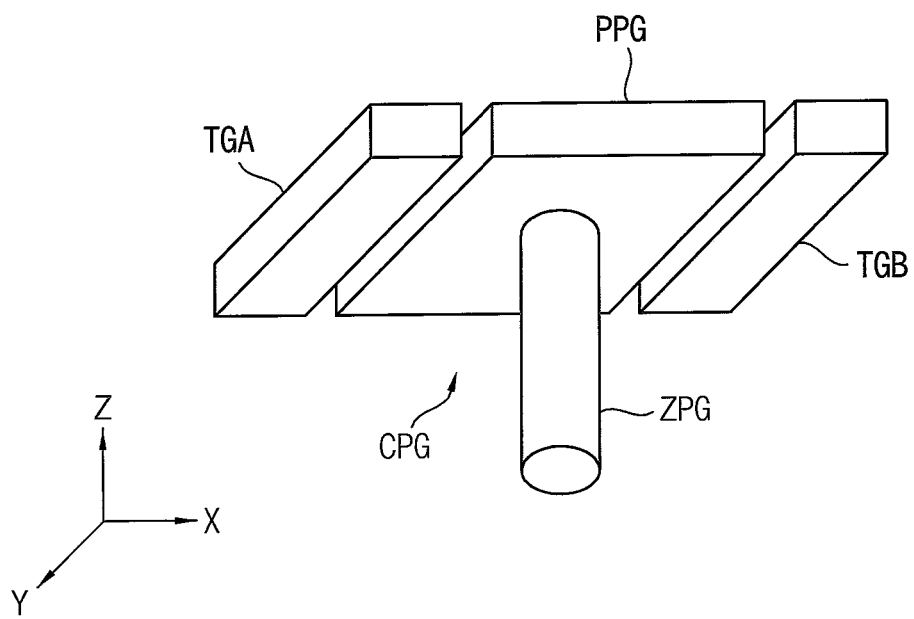
FIGS. 21A and 21B are perspective views illustrating examples of a common photogate of the depth pixel of FIG. 20 according to embodiments of the inventive concept.
Figure 21B:
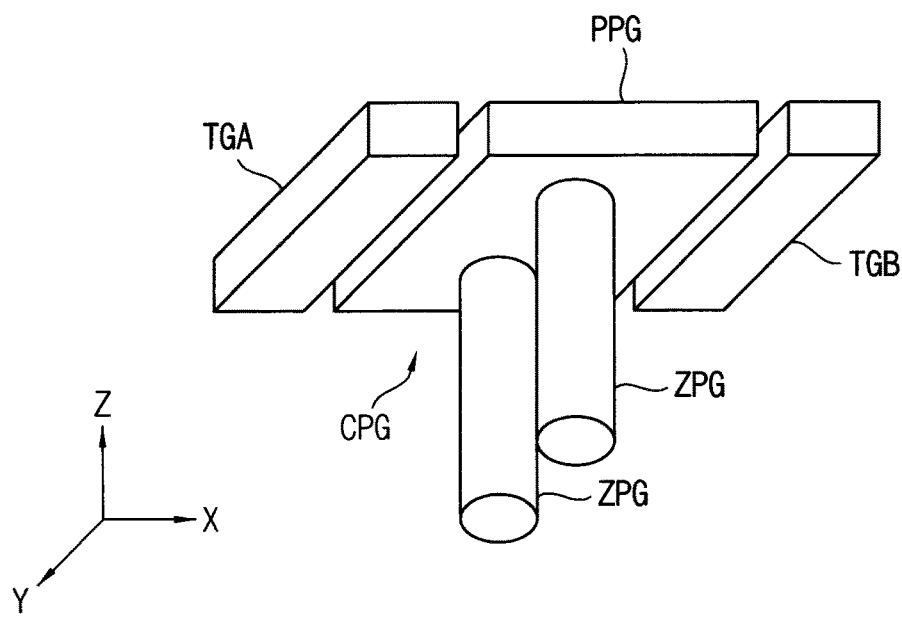

FIG. 20 is a cross-sectional view illustrating a depth pixel according to embodiments of the inventive concept. FIGS. 21A and 21B are perspective views illustrating examples of a common photogate of the depth pixel of FIG. 20 according to embodiments of the inventive concept. For convenience of explanation, a further description of elements and technical aspects previously described may be omitted, and a structure of a common photo gate CPG according to an embodiment is primarily described.

Referring to FIGS. 20, 21A and 21B, a depth pixel PX10 may include a common photo gate CPG and demodulation transfer gates TGA and TGB having the above-described symmetric structure.

The common photo gate CPG may include a horizontal photogate PPG and at least one vertical photogate ZPG. The horizontal photogate PPG may be disposed above an upper surface of a semiconductor substrate SUB, and the horizontal photogate PPG may extend in a plane that is substantially parallel with the upper surface of the semiconductor substrate SUB. The vertical photogate ZPG may be connected to a lower surface of the horizontal photogate PPG and extend in the vertical direction Z substantially perpendicular to the upper surface of the semiconductor substrate SUB. The vertical photogate ZPG may extend near the photodiode PD. The vertical photogate ZPG may be disposed in a trench TRC that is formed in an upper portion of the semiconductor substrate SUB. The trench TRC may be filled with at least one dielectric material.

As such, the collection of the photo charge may be enforced by increasing the surface area of the common photo gate CPG and extending the vertical photogate ZPG near the photodiode PD. For example, in the case of a plurality of vertical photogates ZPG as illustrated in FIG. 21B, the electric fields between the trenches TRC may be further enforced to expedite the collection of the photo charge.

Figure 22:
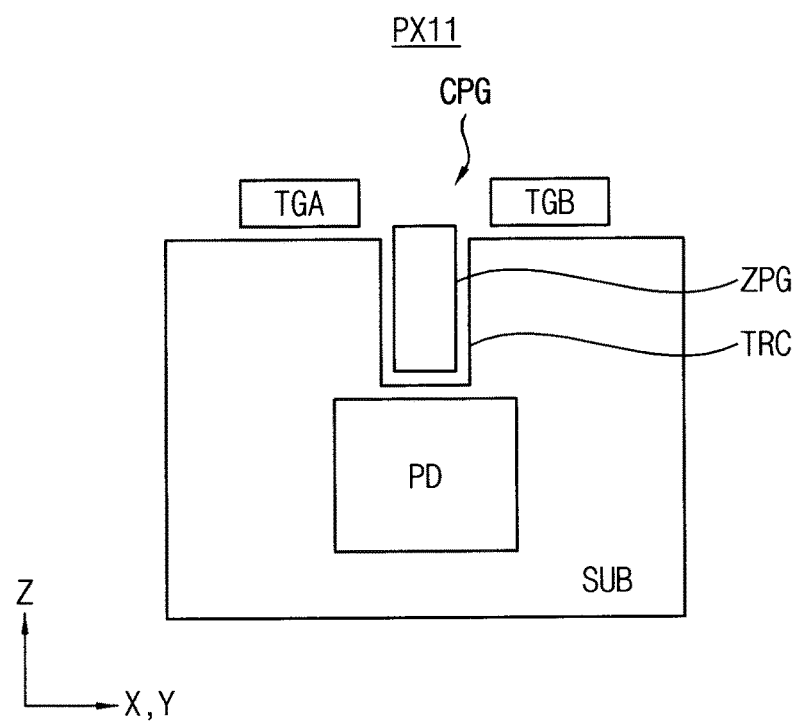
FIG. 22 is a cross-sectional view illustrating a depth pixel according to embodiments of the inventive concept.
Figure 23A:
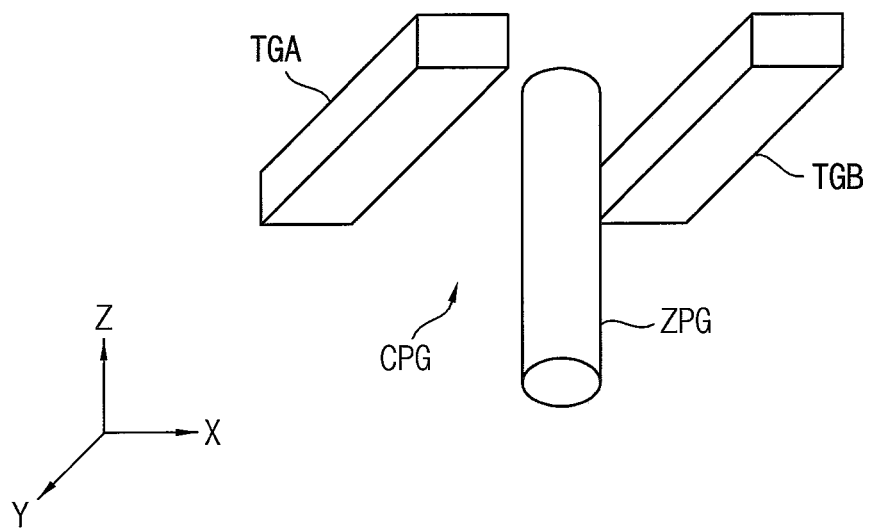
FIGS. 23A and 23B are perspective views illustrating examples of a common photogate of the depth pixel of FIG. 20 according to embodiments of the inventive concept.
Figure 23B:
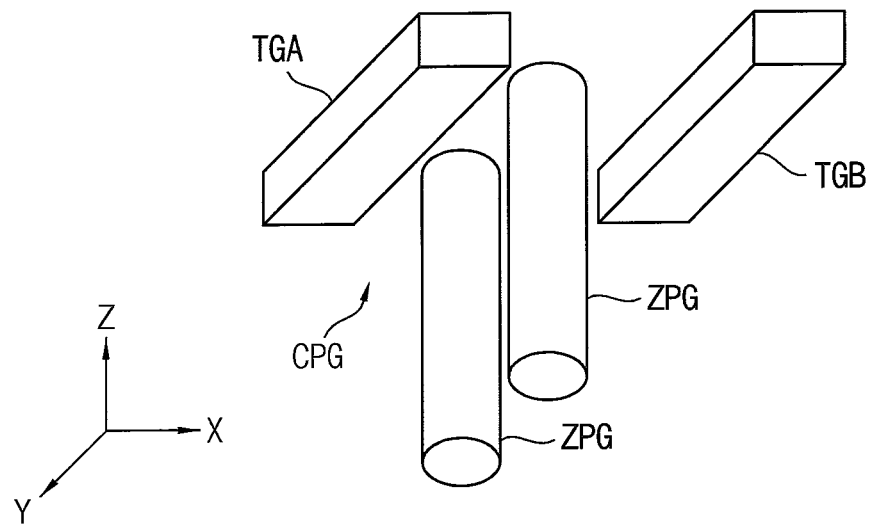

FIG. 22 is a cross-sectional view illustrating a depth pixel according to embodiments of the inventive concept. FIGS. 23A and 23B are perspective views illustrating examples of a common photogate of the depth pixel of FIG. 20 according to embodiments of the inventive concept.

Referring to FIGS. 22, 23A and 23B, a depth pixel PX11 may include a common photo gate CPG and demodulation transfer gates TGA and TGB having the above-described symmetric structure.

The common photo gate CPG may include at least one vertical photogate ZPG. The vertical photogate ZPG may extend in the vertical direction Z substantially perpendicular to the upper surface of the semiconductor substrate SUB. The vertical photogate ZPG may extend near the photodiode PD. The vertical photogate ZPG may be disposed in a trench TRC that is formed in an upper portion of the semiconductor substrate SUB. In comparison with the depth pixel PX10 of FIG. 20, the depth pixel PX11 of FIG. 22 does not include the horizontal photogate PPG.

In the case of a plurality of vertical photogates ZPG as illustrated in FIG. 23B, the plurality of vertical photogates ZPG may be electrically connected through conduction lines above the semiconductor substrate SUB and vertical contacts such as vias.

FIGS. 24 through 27 are diagrams illustrating examples of a layout of a depth pixel according to embodiments of the inventive concept.

Figure 24:
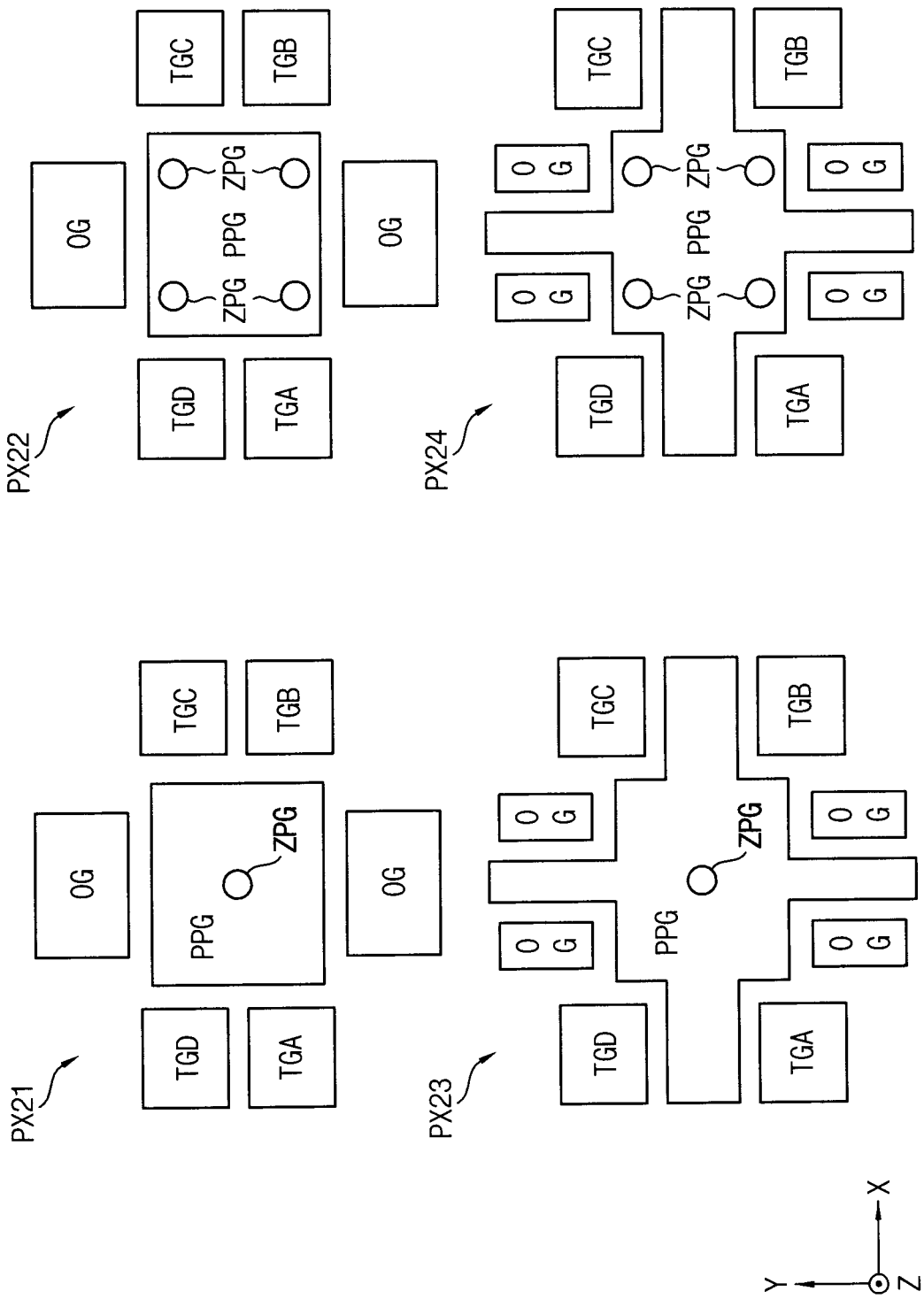
FIGS. 24 through 27 are diagrams illustrating examples of a layout of a depth pixel according to embodiments of the inventive concept.
Figure 25:
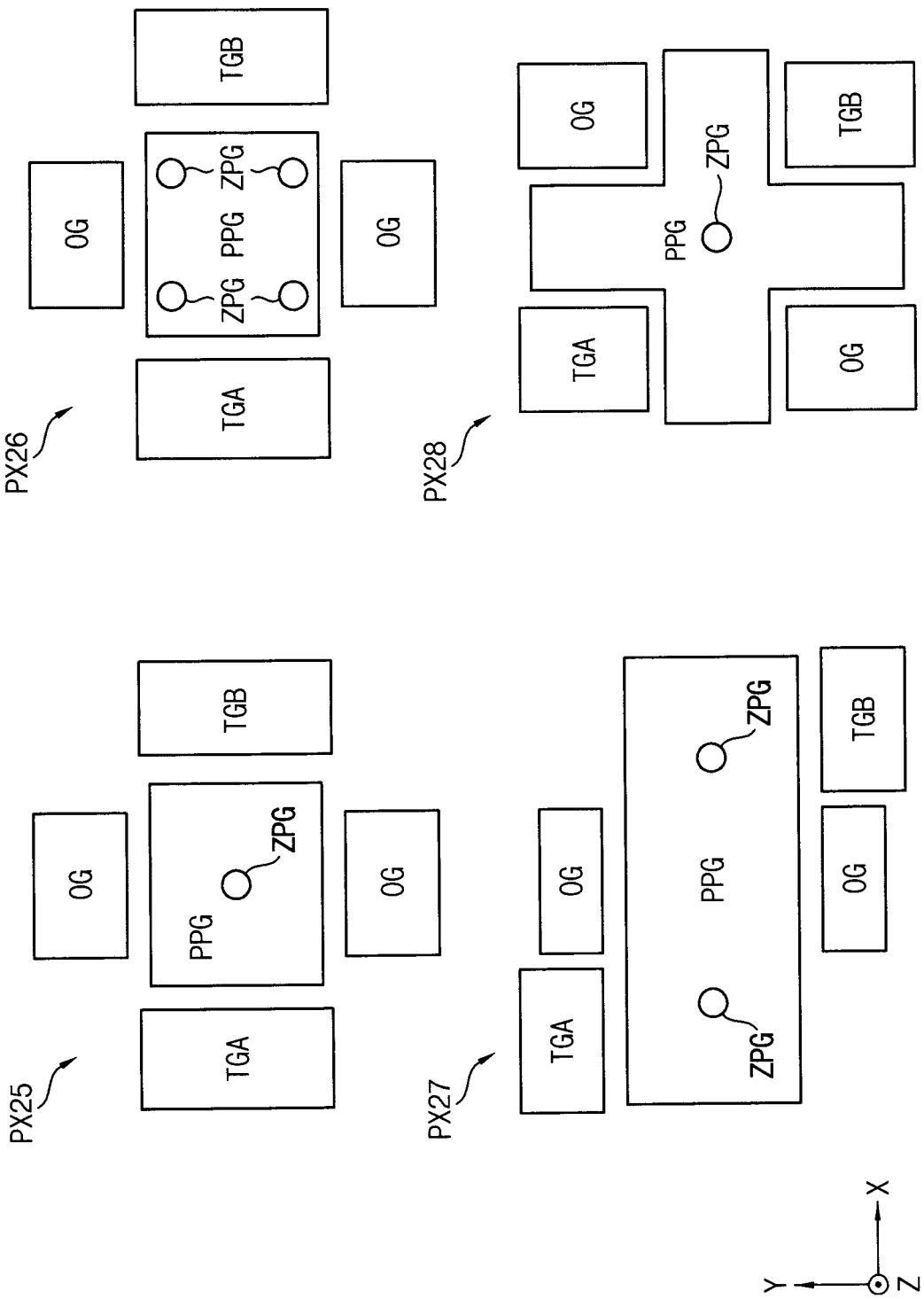

FIG. 24 illustrates depth pixels PX21~PX24 having a four-tap structure such that the common photo gate CPG includes a horizontal photogate PPG and one or more vertical photogates ZPG. FIG. 25 illustrates depth pixels PX25~PX28 having a two-tap structure such that the common photo gate CPG includes a horizontal photogate PPG and one or more vertical photogates ZPG.

Figure 26:
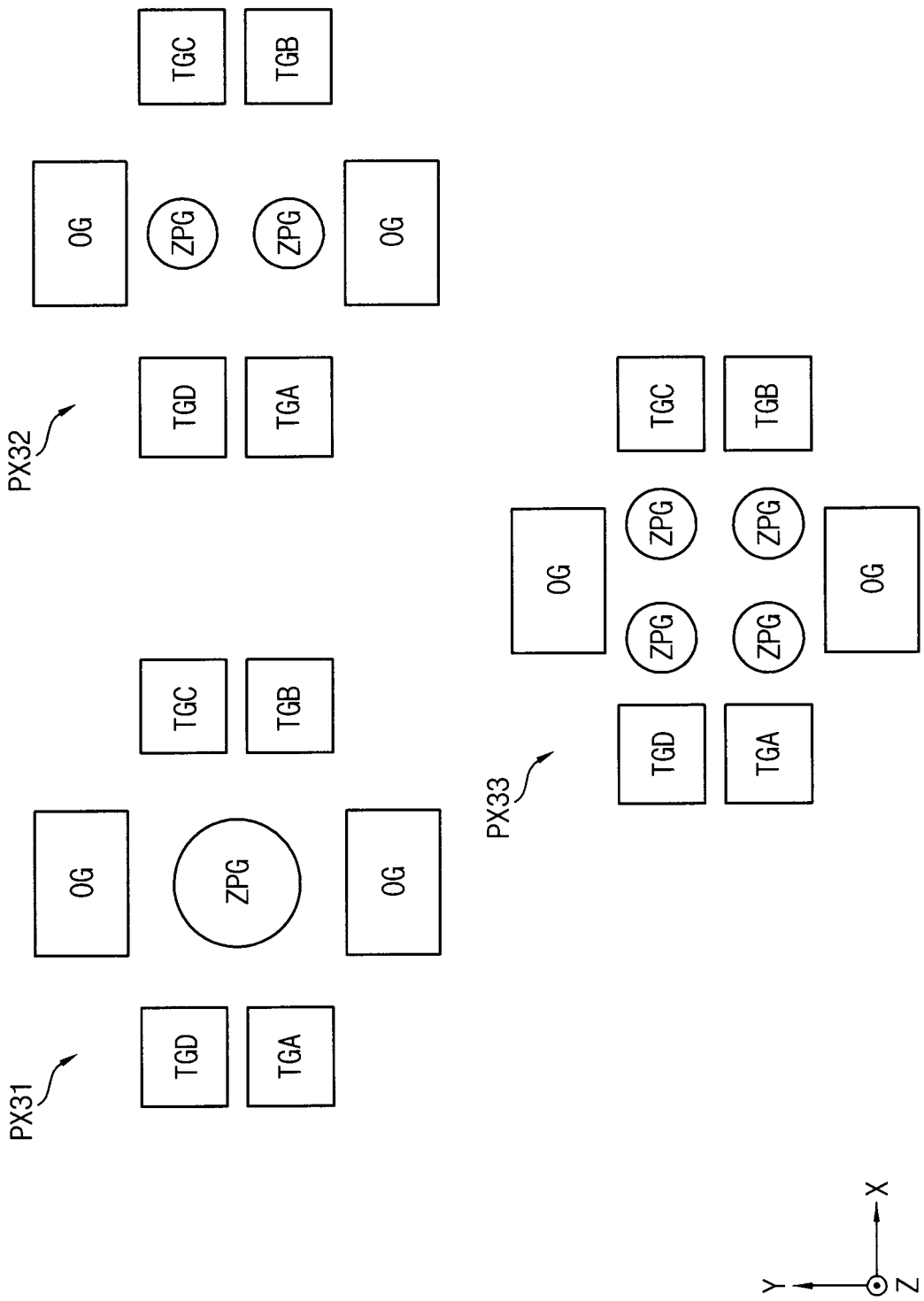
Figure 27:
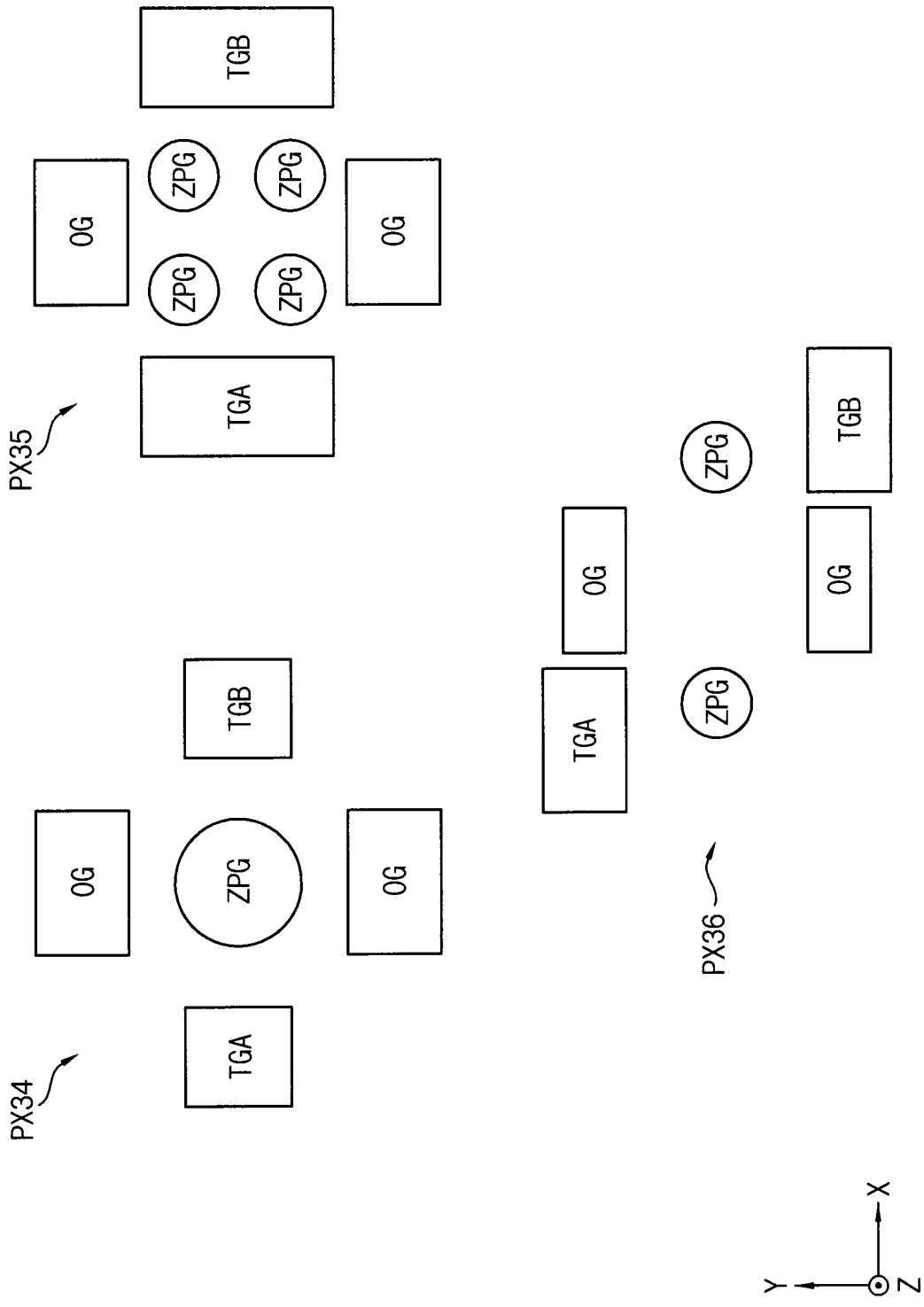

FIG. 26 illustrates depth pixels PX31~PX33 having a four-tap structure such that the common photo gate CPG includes one or more vertical photogates ZPG without a horizontal photogate. FIG. 27 illustrates depth pixels PX34~PX36 having a two-tap structure such that the common photo gate CPG includes one or more vertical photogates ZPG without a horizontal photogate.

As illustrated in FIGS. 24 through 27, the shape of the common photo gate CPG may be variously determined. According to the shape of the common photo gate CPG, the first through fourth demodulation transfer gates TGA, TGB, TGC and TGD and the overflow gates OG, as well as the various number of the vertical photogates ZPG, may be disposed to have the symmetric structure.

Figure 28:
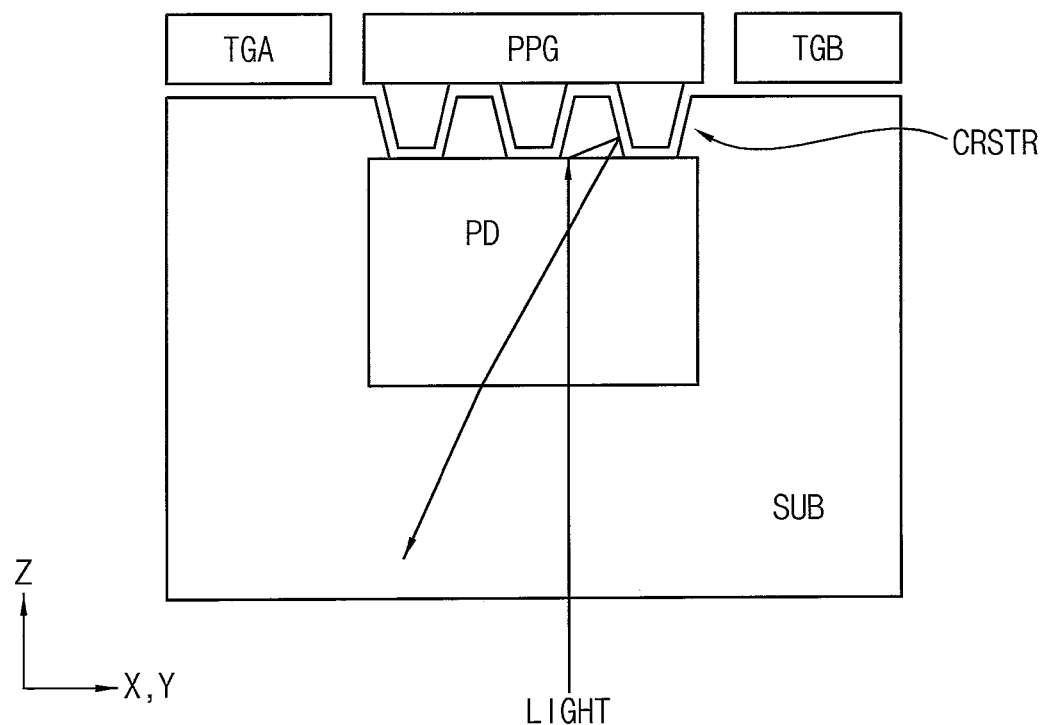
FIG. 28 is a cross-sectional view illustrating a depth pixel according to embodiments of the inventive concept.
Figure 29:
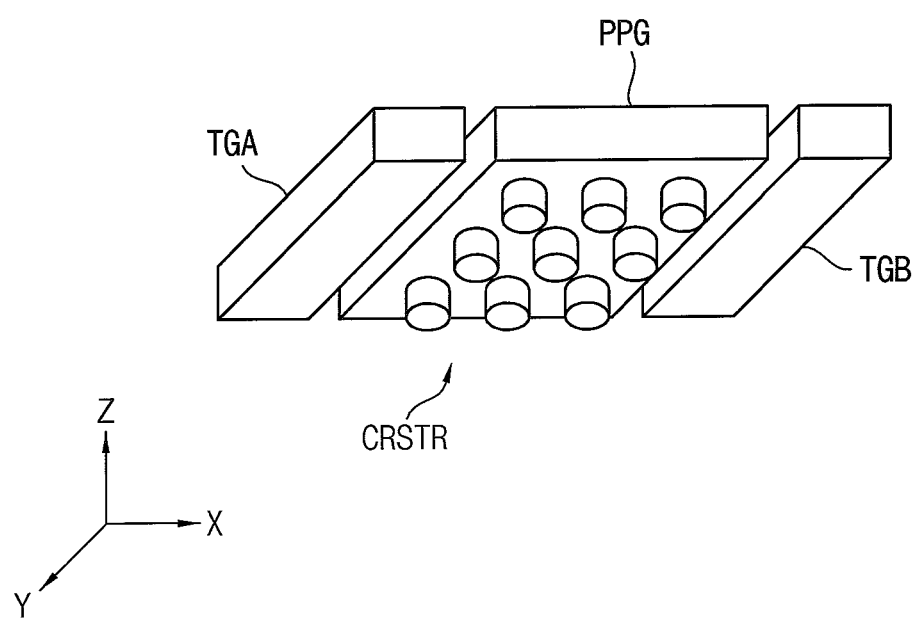
FIG. 29 is a perspective view illustrating an example of a common photogate of the depth pixel of FIG. 28 according to embodiments of the inventive concept.

FIG. 28 is a cross-sectional view illustrating a depth pixel according to embodiments of the inventive concept. FIG. 29 is a perspective view illustrating an example of a common photogate of the depth pixel of FIG. 28 according to embodiments of the inventive concept. For convenience of explanation, a further description of elements and technical aspects previously described may be omitted, and a structure of a common photo gate CPG may be primarily described.

Referring to FIGS. 28 and 29, a depth pixel PX41 may include a common photo gate CPG and demodulation transfer gates TGA and TGB having the above-described symmetric structure.

The common photo gate CPG may include a horizontal photogate PPG. The horizontal photogate PPG may be disposed above an upper surface of a semiconductor substrate SUB, and the horizontal photogate PPG may extend in a plane that is substantially parallel with the upper surface of the semiconductor substrate SUB.

As illustrated in FIGS. 28 and 29, a lower surface of the horizontal photogate PPG may have a corrugated shape CRSTR to induce reflection and scattering of a light. A corrugated shape CRSTR may refer to a shape including a plurality of ridges (or protrusions) and grooves (or recesses). For example, a corrugated shape CRSTR may include a plurality of ridges (or protrusions) separated from each other by a plurality of grooves (or recesses). The corrugated shape CRSTR will be described in further detail below. The light may reside in the semiconductor substrate SUB longer, and the sensing sensitivity of the depth pixel PX41 may be increased.

FIGS. 30A, 30B, 30C, 31A, 31B, 31C and 32 are cross-sectional diagrams illustrating a depth pixel according to embodiments of the inventive concept. FIGS. 30A, 30B, 30C, 31A, 31B, 31C and 32 illustrate structures corresponding to a back-side illumination (BSI) such that a light is incident through a lower surface 12 of a semiconductor substrate SUB.

Referring to FIGS. 30A, 30B, 30C, 31A, 31B and 31C, each of depth pixels PX51~PX56 may include a common photo gate CPG disposed adjacent to an upper surface 11 of the semiconductor substrate SUB and a plurality of demodulation transfer gates TGA and TGB having the symmetric structure described above.

As illustrated in FIGS. 30A, 30B, 30C, 31A, 31B and 31C, each of depth pixels PX51~PX56 may include an anti-reflection layer RFL, a planarization layer PNL and a microlens MLN. The anti-reflection layer RFL may be disposed adjacent to the lower surface 12 of the semiconductor substrate SUB where a light is incident through the lower surface 12 of the semiconductor substrate SUB. The anti-reflection layer RFL may reflect the light that is scattered and/or reflected inside the semiconductor substrate SUB, and thus, the sensing sensitivity may be increased by causing the light to reside longer in the semiconductor substrate SUB. For example, the anti-reflection layer RFL may have a stack structure of fixed charge layers and oxides. The anti-reflection layer RFL may be an insulating film of high permittivity and may be manufactured by an atomic layer deposition (ALD) process. For example, the anti-reflection layer RFL may be implemented with hafnium oxide, aluminium oxide, titanium oxide, strontium titan oxide, etc.

The planarization layer PNL may be disposed adjacent to a lower surface of the anti-reflection layer RFL. For example, the planarization layer PNL may be implemented with silicon oxide, silicon nitride, silicon oxynitride, etc.

The microlens MLN may be disposed adjacent to a lower surface of the planarization layer PNL. The light focused by the microlens may be concentrated on the photodiode PD. For example, the microlens MLN may be implemented with styrol resin, acrylate resin, siloxane resin, etc.

In addition, each of depth pixels PX51~PX56 may include a pixel isolation structure extending in the vertical direction Z substantially perpendicular to the lower surface 12 of the semiconductor substrate SUB and disposed in boundary regions of the depth pixel to block lights from other depth pixels. The pixel isolation structure may block lights from other depth pixels.

Figure 30A:
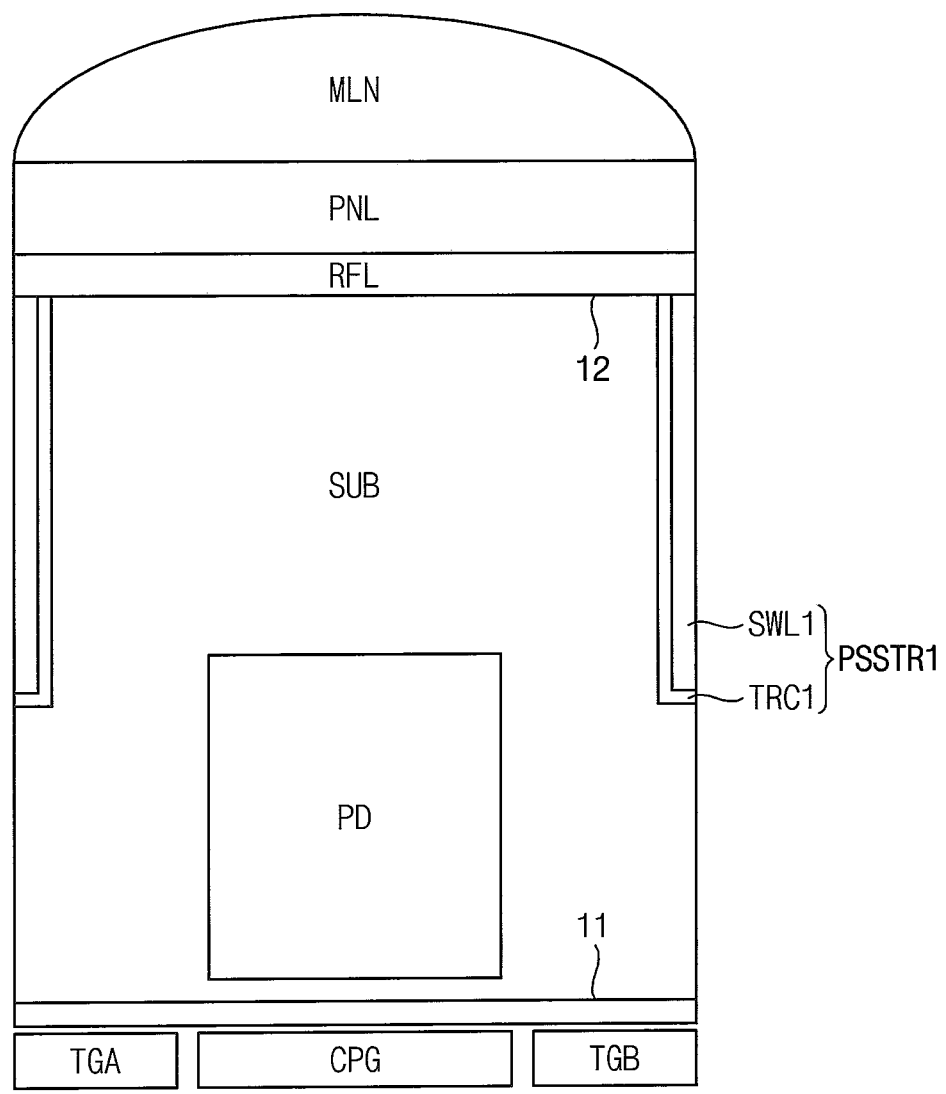
FIGS. 30A, 30B, 30C, 31A, 31B, 31C and 32 are cross-sectional diagrams illustrating a depth pixel according to embodiments of the inventive concept.

In embodiments, as illustrated in FIG. 30A, the depth pixel PX51 may include a back-side isolation structure PSSTR1 extending in the vertical direction Z from the lower surface 12 of the semiconductor substrate SUB. A trench TRC1 may be formed to a predetermined depth and a side wall SWL1 may be formed in the trench TRC1. The side wall SWL1 may block the light from penetrating to the adjacent pixels. For example, the side wall SWL1 may be implemented with at least one material similar to that of the anti-reflection material RFL. The trench TRC1 may be filled with at least one dielectric material.

Figure 30B:
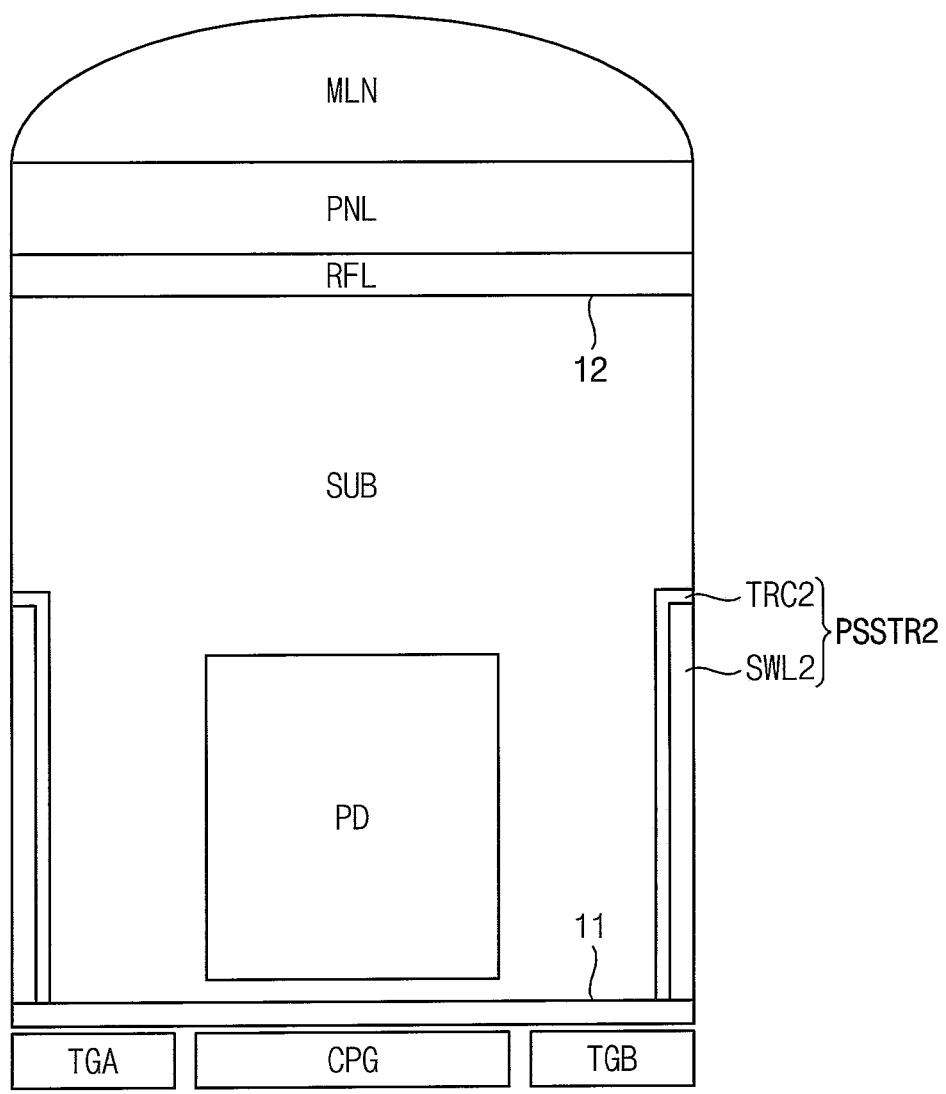
Figure 30C:
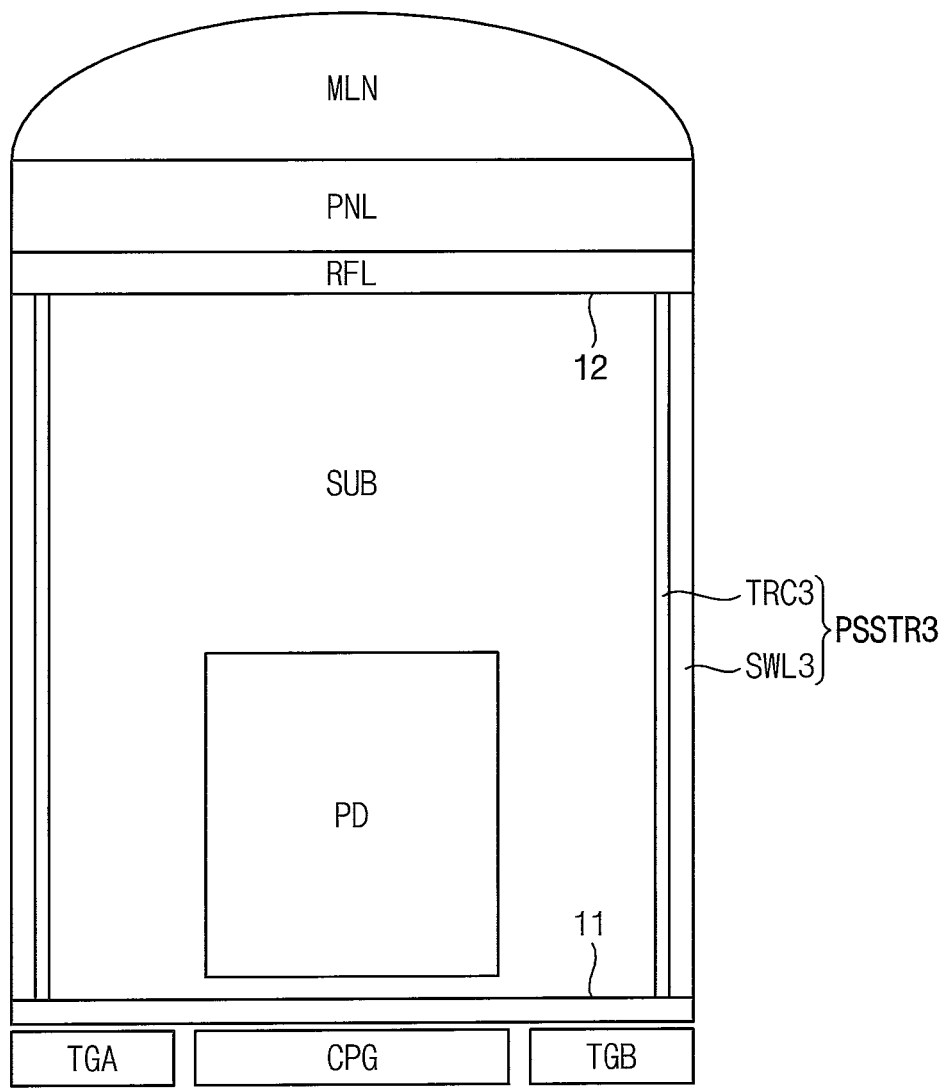

In embodiments, as illustrated in FIG. 30B, the depth pixel PX52 may include a front-side isolation structure PSSTR2 extending in the vertical direction Z from the upper surface 11 of the semiconductor substrate SUB, which includes a trench TRC2 and a side wall SWL2. In embodiments, as illustrated in FIG. 30C, the depth pixel PX53 may include a full isolation structure PSSTR3 extending in the vertical direction Z from the upper surface 11 to the lower surface 12 of the semiconductor substrate SUB, which includes a trench TRC3 and a side wall SWL3.

Figure 31A:
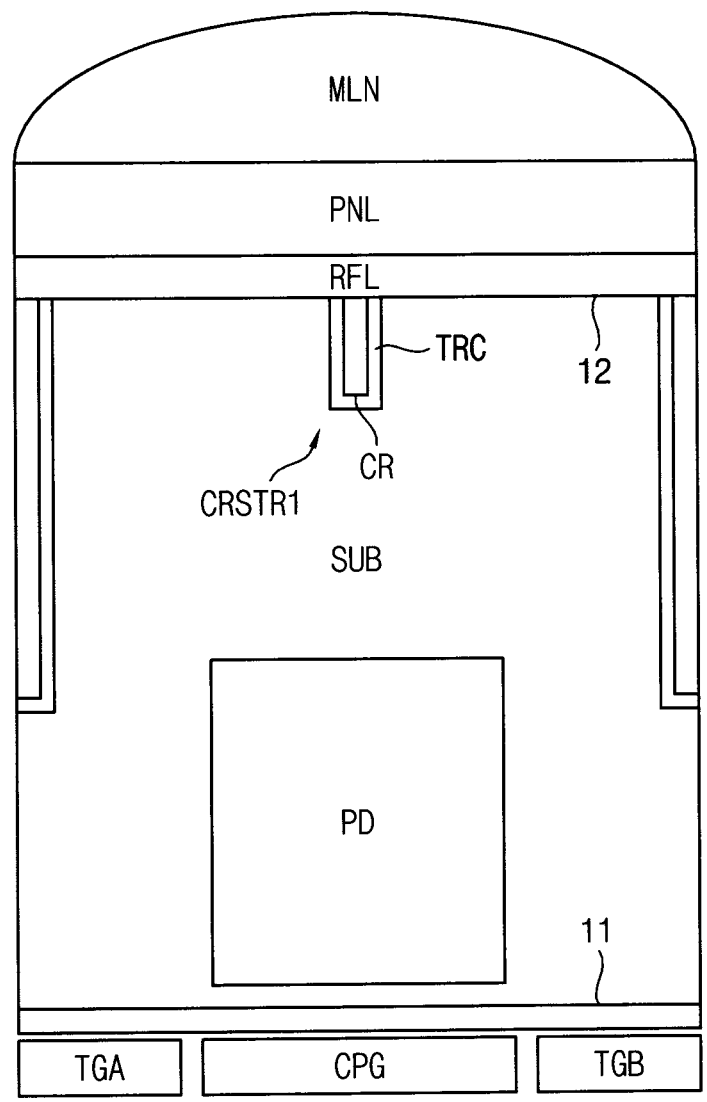
Figure 31B:
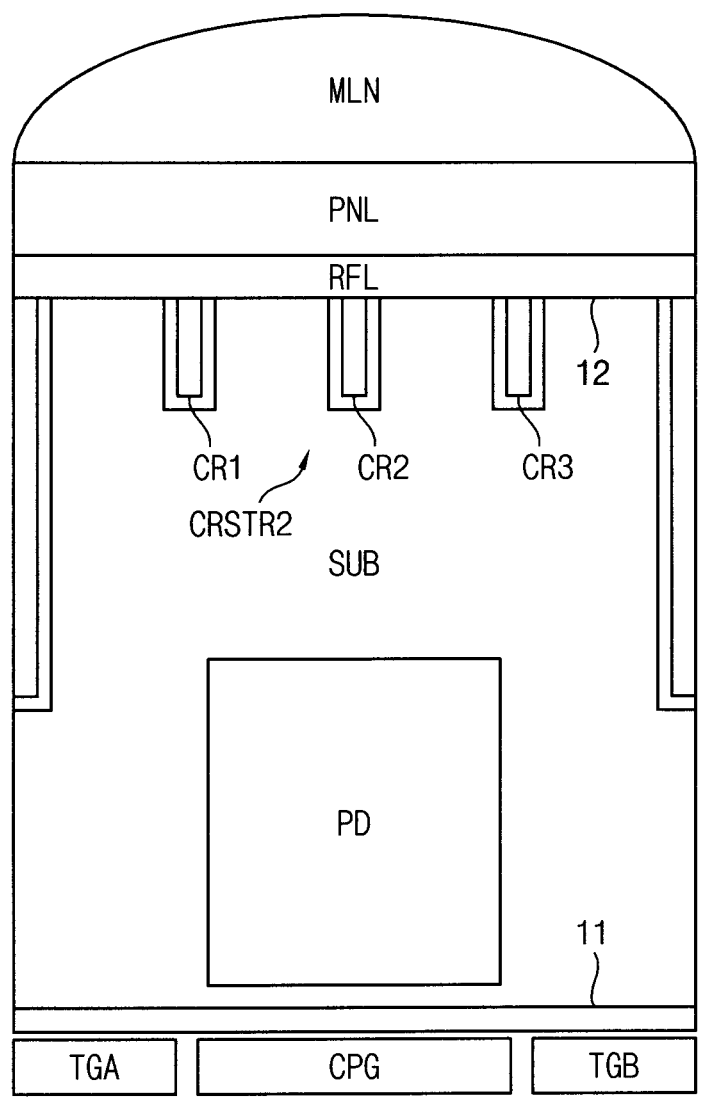
Figure 31C:
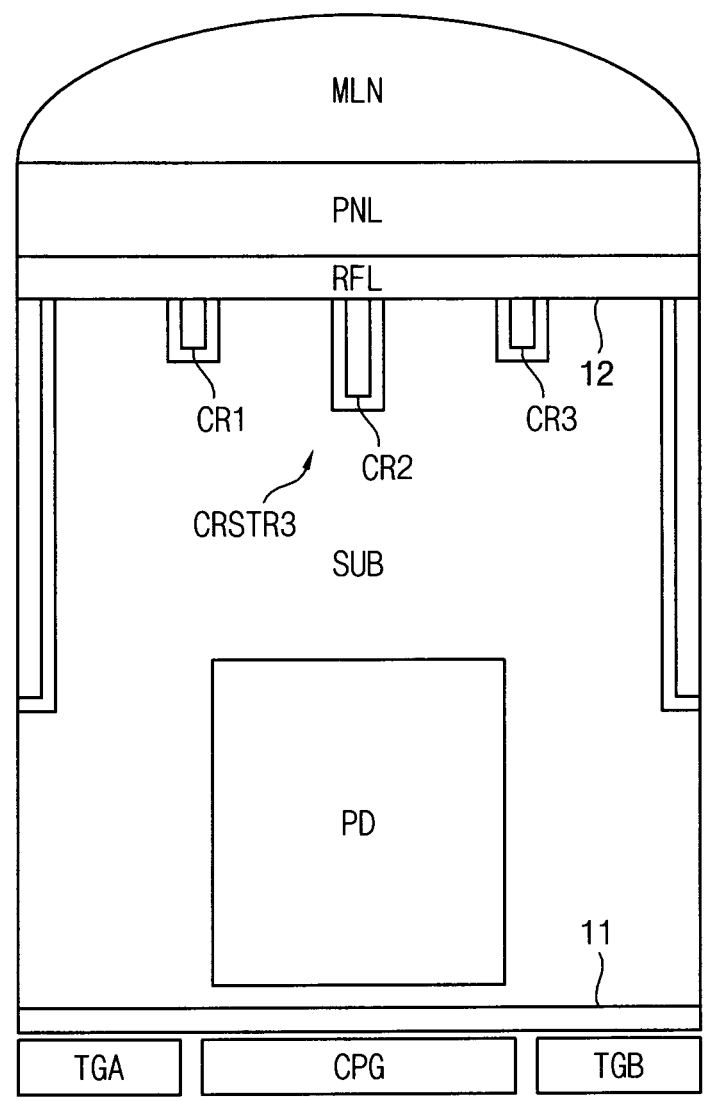

As illustrated in FIGS. 31A through 31C, each of depth pixels PX54~PX56 may include a corrugated structure disposed adjacent to the upper surface of the anti-reflection layer RFL to induce reflection and scattering of a light.

As illustrated in FIG. 31A, a corrugated structure CRSTR1 may include a single ridge CR formed in a trench TRC. As illustrated in FIG. 31B, a corrugated structure CRSTR2 may include a plurality of ridges CR1~CR3. According to embodiments, as illustrated in FIG. 31C, a corrugated structure CRSTR3 may include a plurality of ridges CR1~CR3 having different depths from each other. The ridges CR and CR1~CR3 may also be referred to as protrusions.

Figure 32:
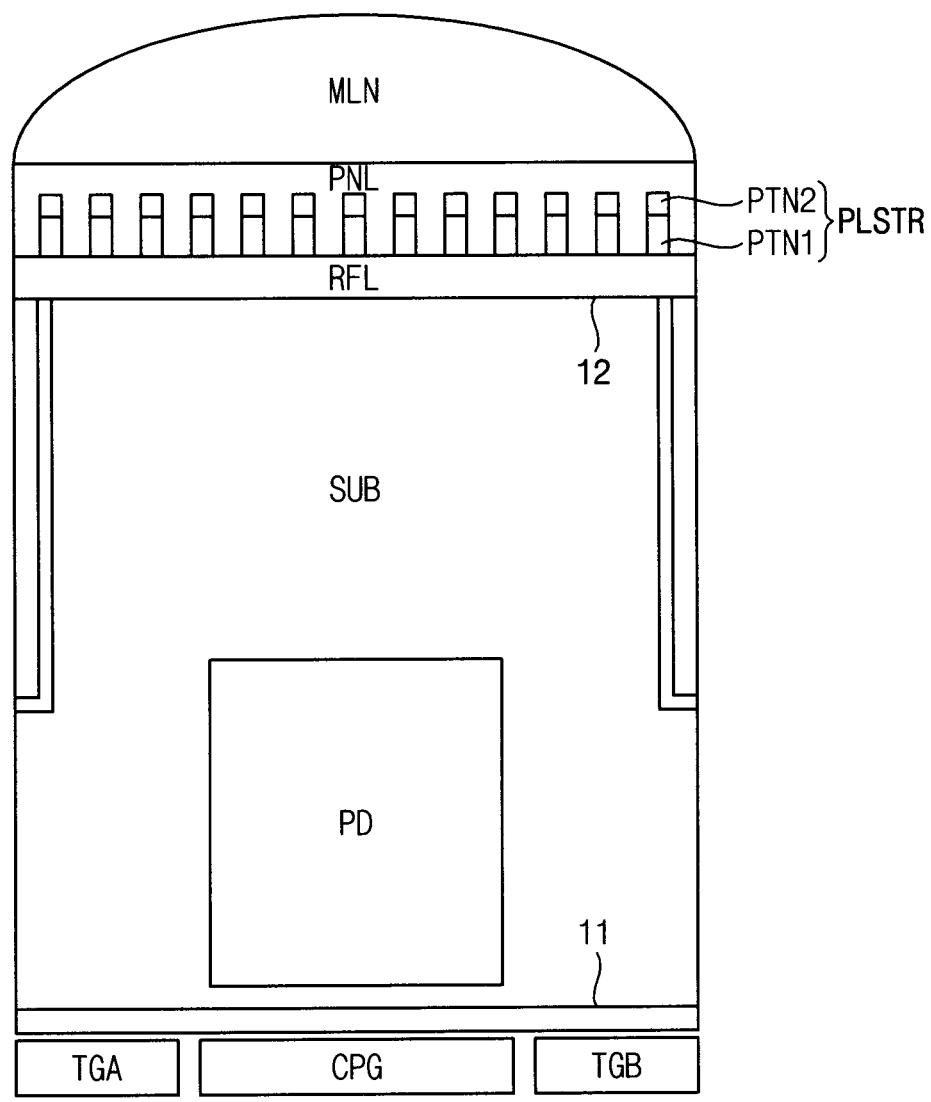

Referring to FIG. 32, a depth pixel PX61 may include a polarization structure PLSTR disposed adjacent to the lower surface of the anti-reflection layer RFL to selectively pass a light of a particular polarization axis. The polarization structure may be a stacked structure of metal patterns PTN1 and dielectric patterns PTN2.

Figure 33A:
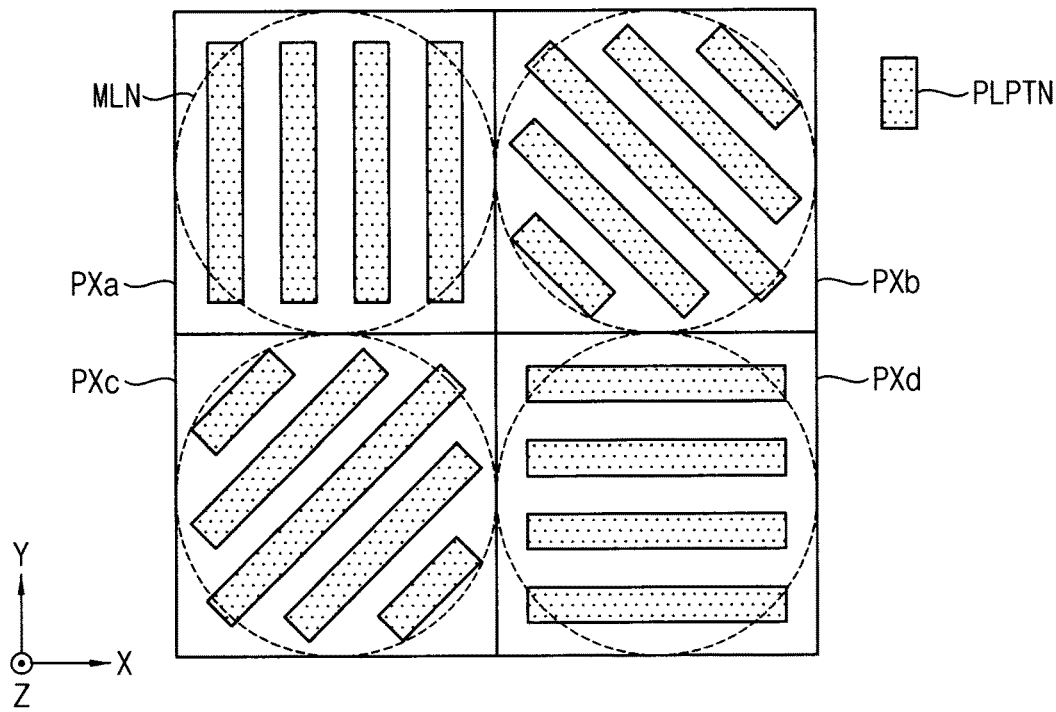
FIGS. 33A and 33B are diagrams illustrating examples of a polarization structure of the depth pixel of FIG. 32 according to embodiments of the inventive concept.
Figure 33B:
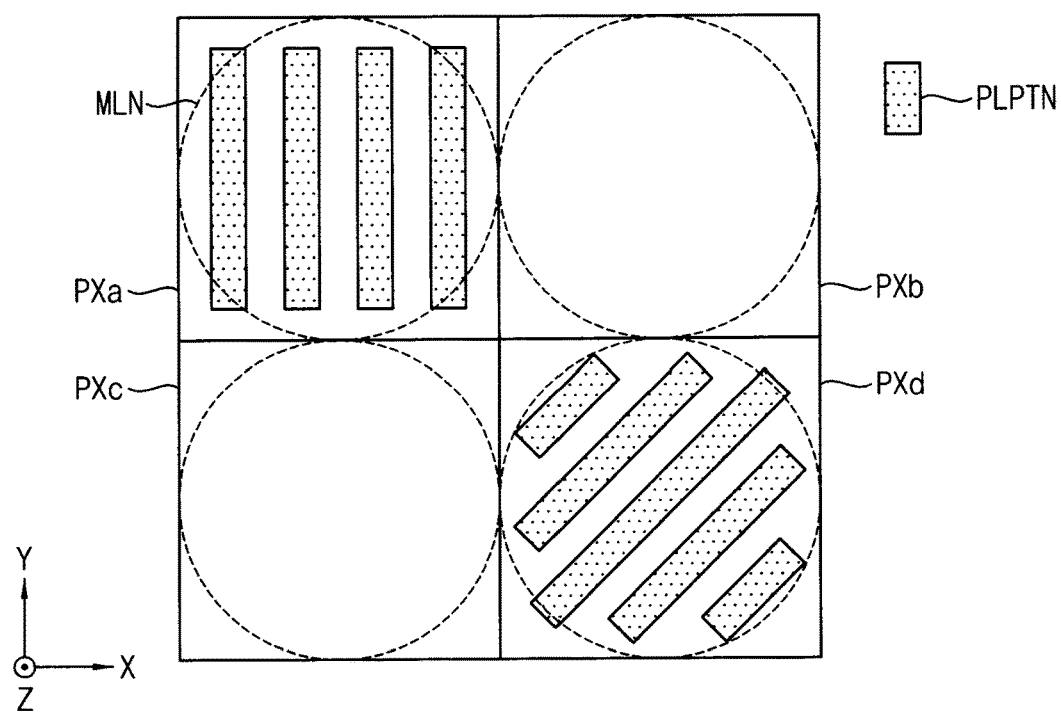

FIGS. 33A and 33B are diagrams illustrating examples of a polarization structure of the depth pixel of FIG. 32 according to embodiments of the inventive concept.

Referring to FIG. 33A, four depth pixels PXa, PXb, PXc and PXd, which are adjacent in the horizontal direction HLX and the vertical direction HLY, may include polarization structures, respectively, such that polarization patterns PLPTN sequentially rotate by about 90 degrees. Referring to FIG. 33B, in an embodiment, some depth pixels PXa and PXd of the four adjacent depth pixels PXa, PXb, PXc and PXd may include the polarization patterns PLPTN and the other depth pixels PXb and PXc do not include the polarization patterns PLPTN.

Figure 34:
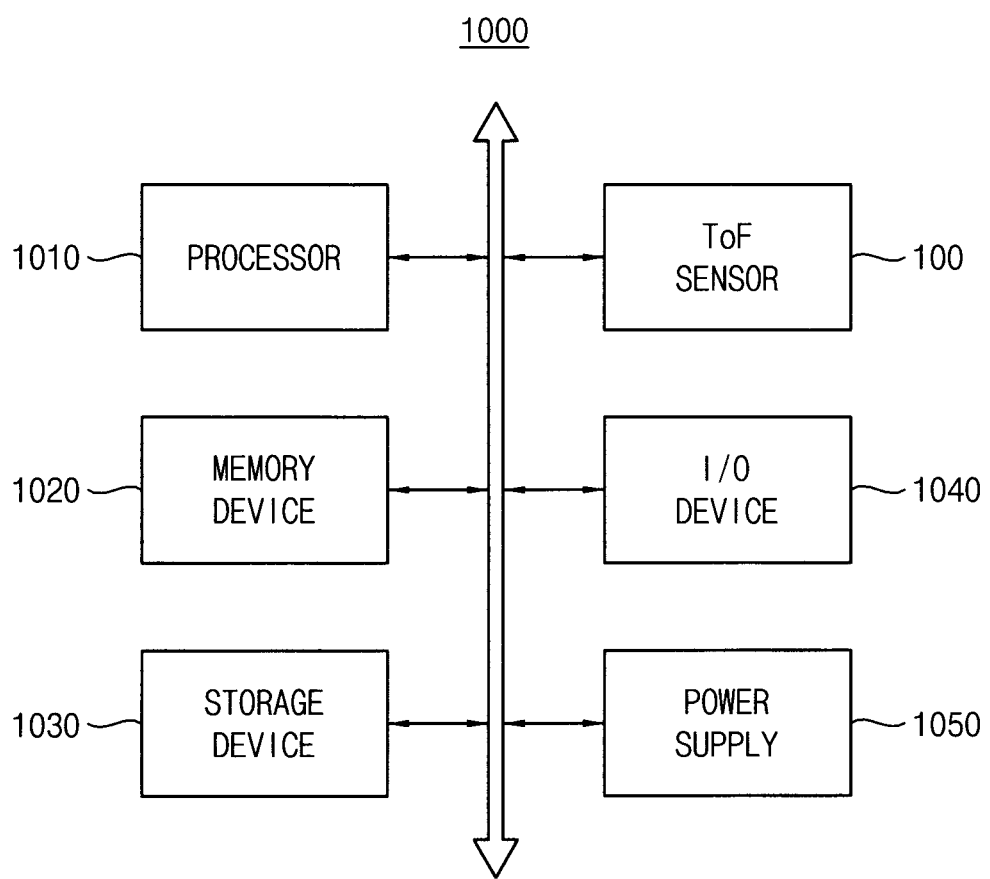
FIG. 34 is a block diagram illustrating a computing system including a ToF sensor according to embodiments of the inventive concept.

FIG. 34 is a block diagram illustrating a computing system including a ToF sensor according to embodiments of the inventive concept.

Referring to FIG. 34, a computing system 1000 includes a processor 1010, a memory device 1020, a storage device 1030, an input/output device 1040, a power supply 1050 and/or a ToF sensor 100. In an embodiment, the computing system 1000 may further include a port for communicating with electronic devices such as, for example, a video card, a sound card, a memory card, a USB device, etc.

The processor 1010 may perform specific calculations and/or tasks. For example, the processor 1010 may be a microprocessor, a central process unit (CPU), a digital signal processor, or the like. The processor 1010 may communicate with the memory device 1020, the storage device 1030 and the input/output device 1040 via an address bus, a control bus and/or a data bus.

The processor 1010 may be coupled to an extension bus such as, for example, a peripheral component interconnect (PCI) bus. The memory device 1020 may store data for operating the computing system 1000.

For example, the memory device 1020 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like. The storage device 1030 may include, for example, a solid state drive, a hard disk drive, a CD-ROM, or the like. The input/output device 1040 may include an input device such as, for example, a keyboard, a mouse, a keypad, etc., and an output device such as, for example, a printer, a display device, or the like. The power supply 1050 may supply power to the computing device 1000.

The ToF sensor 100 may be coupled to the processor 1010 via the buses or other communication links. As described above, the ToF sensor 100 may include at least one depth pixel having the symmetric structure centered on the common photo gate according to embodiments of the inventive concept. The ToF sensor 100 may be integrated with the processor 1010 in the same chip, or the ToF sensor 100 and the processor 1010 may be integrated in respective chips.

Figure 35:
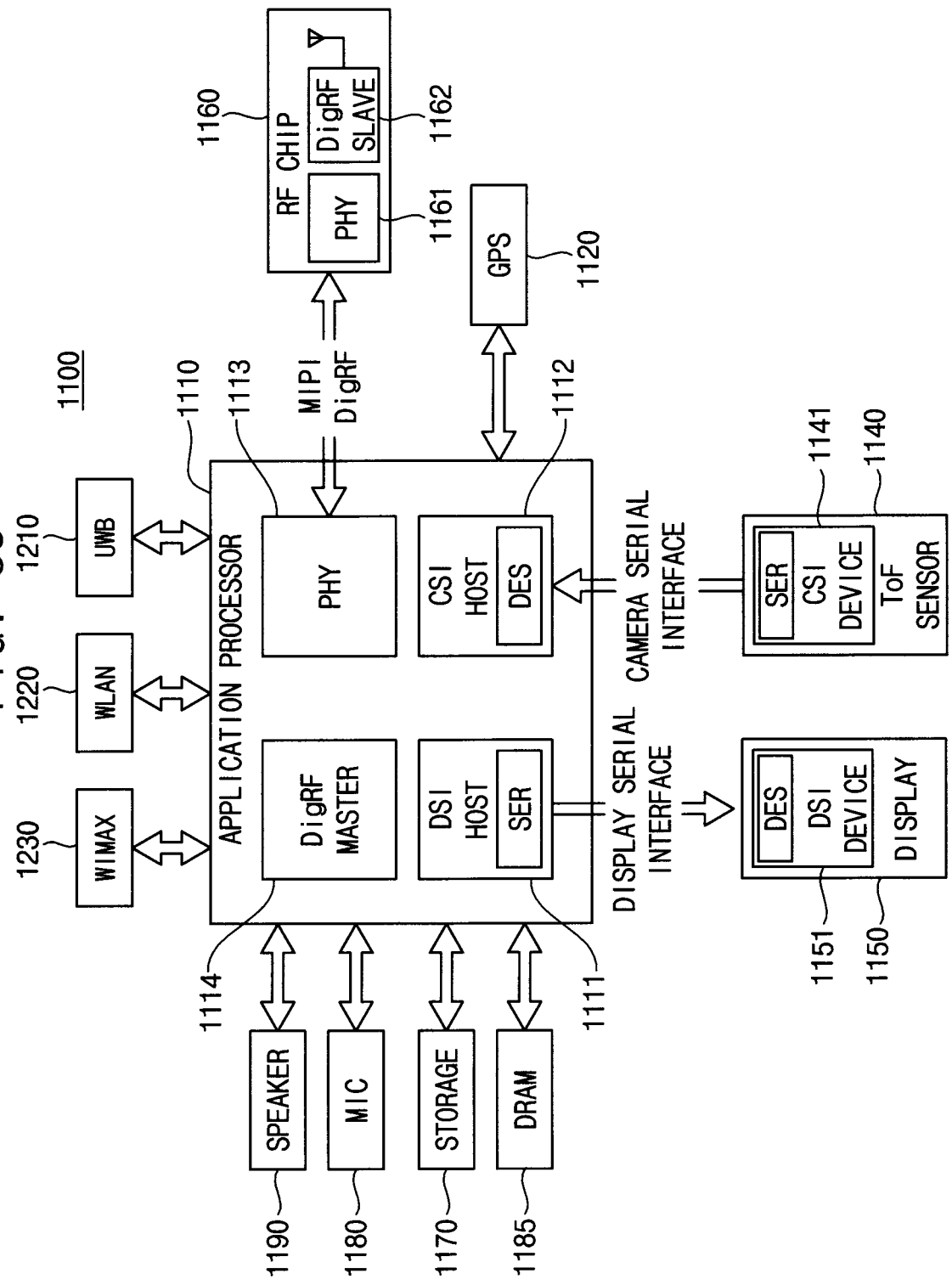
FIG. 35 is a block diagram illustrating an example of an interface used in the computing system of FIG. 34 according to embodiments of the inventive concept.

FIG. 35 is a block diagram illustrating an example of an interface used in the computing system of FIG. 34 according to embodiments of the inventive concept.

Referring to FIG. 35, a computing system 1100 may employ or support a MIPI interface, and may include an application processor 1110, a ToF sensor 1140 and a display device 1150. A CSI host 1112 of the application processor 1110 may perform a serial communication with a CSI device 1141 of the ToF sensor 1140 using a camera serial interface (CSI). In embodiments, the CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI). In embodiments, the DSI host 1111 may include a serializer SER, and the DSI device 1151 may include a deserializer DES.

The computing system 1100 may further include a radio frequency (RF) chip 1160, which may include a physical layer PHY 1161 and a DigRF slave 1162. A physical layer PHY 1113 of the application processor 1110 may perform data transfer with the physical layer PHY 1161 of the RF chip 1160 using a MIPI DigRF. The PHY 1113 of the application processor 1110 may interface (or alternatively communicate) a DigRF MASTER 1114 for controlling the data transfer with the PHY 1161 of the RF chip 1160.

The computing system 1100 may further include a global positioning system (GPS) 1120, a storage device 1170, a microphone 1180, a DRAM 1185 and/or a speaker 1190. The computing system 1100 may communicate with external devices using an ultra-wideband (UWB) communication interface 1210, a wireless local area network (WLAN) communication interface 1220, a worldwide interoperability for microwave access (WIMAX) communication interface 1230, or the like. However, embodiments are not limited to configurations or interfaces of the computing system 1000 and 1100 illustrated in FIGS. 34 and 35.

As described above, the depth pixel according to embodiments of the inventive concept may reduce the size and power consumption of the ToF sensor including the depth pixel by applying the common photogate. In addition, the depth pixel according to embodiments may increase sensing accuracy and sensing sensitivity through the symmetric structure and the modified structure of the common photogate, and increase performance of the ToF sensor including the depth pixel.

Embodiments of the present inventive concept may be applied to any devices and systems including a ToF sensor. For example, embodiments of the inventive concept may be applied to systems such as a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, etc.

As is traditional in the field of the present inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. A depth pixel of a time-of flight (ToF) sensor, the depth pixel comprising:
   a common photogate disposed in a center region of the depth pixel;
   a plurality of floating diffusion regions disposed in a peripheral region surrounding the center region;
   a plurality of demodulation transfer gates disposed in the peripheral region and configured to transfer a photo charge collected by the common photogate to the plurality of floating diffusion regions,
   wherein the plurality of demodulation transfer gates is symmetric with respect to each of a horizontal line and a vertical line that pass through a center of the depth pixel and are substantially perpendicular to each other; and
   a plurality of overflow gates disposed in the peripheral region and configured to drain the photo charge collected by the common photogate,
   wherein the plurality of overflow gates is symmetric with respect to each of the horizontal line and the vertical line,
   wherein the common photogate comprises:
   at least one vertical photogate extending in a vertical direction substantially perpendicular to an upper surface of a semiconductor substrate,
   wherein the vertical photogate is disposed in a trench that is formed in an upper portion of the semiconductor substrate such that a portion of the vertical photogate is disposed below the upper surface of the semiconductor substrate.

2. The depth pixel of claim 1, wherein a photogate voltage applied to the common photogate has a direct current (DC) voltage level that causes collecting of the photo charge during an integration period, an overflow gate voltage applied to the plurality of overflow gates has a turn-off voltage level that causes draining of the photo charge to be blocked during the integration period, and a plurality of demodulation signals of different phases is applied to the plurality of demodulation transfer gates during the integration period.

3. The depth pixel of claim 2, wherein the overflow gate voltage has a turn-on voltage level that causes the photo charge collected by the common photogate during a reset period in which the depth pixel is initiated and a readout period in which an amount of the photo charge collected by the common photogate is measured to be drained.

4. The depth pixel of claim 2, wherein the DC voltage level of the photogate voltage during a reset period in which the depth pixel is initialized and a readout period in which an amount of the photo charge collected by the common photogate is measured is about equal to the DC voltage level during the integration period.

5. The depth pixel of claim 2, wherein the DC voltage level of the photogate voltage during a reset period in which the depth pixel is initialized and a readout period in which an amount of the photo charge collected by the common photogate is measured is different from the DC voltage level during the integration period.

6. The depth pixel of claim 1, wherein the common photogate comprises:
   a horizontal photogate disposed above the upper surface of the semiconductor substrate,
   wherein the horizontal photogate extends in a plane that is substantially parallel with the upper surface of the semiconductor substrate.

7. The depth pixel of claim 6, wherein a lower surface of the horizontal photogate has a corrugated shape that induces reflection and scattering of a light.

8. The depth pixel of claim 1, the common photogate comprises:
a horizontal photogate disposed above the upper surface of the semiconductor substrate,
wherein the horizontal photogate extends in a plane that is substantially parallel with the upper surface of the semiconductor substrate,
wherein the at least one vertical photogate is connected to a lower surface of the horizontal photogate.

9. The depth pixel of claim 1, further comprising:
a plurality of charge storing structures respectively disposed in the peripheral region between the plurality of floating diffusion regions and the plurality of demodulation transfer gates and configured to temporarily store the photo charge collected by the common photogate before transferring the photo charge to the plurality of floating diffusion regions.

10. The depth pixel of claim 1, further comprising:
an anti-reflection layer disposed adjacent to a lower surface of the semiconductor substrate,
wherein a light is incident through the lower surface of the semiconductor substrate;
a planarization layer disposed adjacent to a lower surface of the anti-reflection layer;
a microlens disposed adjacent to a lower surface of the planarization layer; and
a pixel isolation structure extending in the vertical direction, which is substantially perpendicular to the lower surface of the semiconductor substrate and disposed in boundary regions of the depth pixel,
wherein the pixel isolation structure is configured to block lights from other depth pixels.

11. The depth pixel of claim 10, further comprising:
a corrugated structure disposed adjacent to an upper surface of the anti-reflection layer and configured to induce reflection and scattering of the light.

12. The depth pixel of claim 10, further comprising:
a polarization structure disposed adjacent to the lower surface of the anti-reflection layer and configured to selectively pass a light of a particular polarization axis.

13. The depth pixel of claim 1, wherein the depth pixel has a two-tap structure such that the plurality of demodulation transfer gates includes a first demodulation transfer gate and a second demodulation transfer gate that are symmetrical with respect to the center of the depth pixel,
wherein a first demodulation signal is applied to the first demodulation transfer gate and a second demodulation signal having a phase difference of about 180 degrees with respect to the first demodulation signal is applied to the second demodulation transfer gate during an integration period.

14. The depth pixel of claim 1, wherein the depth pixel has a four-tap structure such that the plurality of demodulation transfer gates includes a first demodulation transfer gate, a second demodulation transfer gate, a third demodulation transfer gate and a fourth demodulation transfer gate,
wherein the first demodulation transfer gate and the third demodulation gate are symmetrical with respect to the center of the depth pixel, and the second demodulation transfer gate and the fourth demodulation gate are symmetrical with respect to the center of the depth pixel,
wherein a first demodulation signal is applied to the first demodulation transfer gate, a second demodulation signal having a phase difference of about 90 degrees with respect to the first demodulation signal is applied to the second demodulation transfer gate, a third demodulation signal having a phase difference of about 180 degrees with respect to the first demodulation signal is applied to the third demodulation transfer gate and a fourth demodulation signal having a phase difference of about 270 degrees with respect to the first demodulation signal is applied to the fourth demodulation transfer gate during an integration period.

15. The depth pixel of claim 1, wherein at least two floating diffusion regions of the plurality of floating diffusion regions are electrically connected to each other.

16. A depth pixel of a time-of flight (ToF) sensor, the depth pixel comprising:
a common photogate disposed in a center region of the depth pixel,
wherein the common photogate comprises at least one vertical photogate extending in a vertical direction substantially perpendicular to an upper surface of a semiconductor substrate, and the at least one vertical photogate is disposed in a trench that is formed in an upper portion of the semiconductor substrate such that a portion of the vertical photogate is disposed below the upper surface of the semiconductor substrate;
a plurality of floating diffusion regions disposed in a peripheral region surrounding the center region;
a plurality of demodulation transfer gates disposed in the peripheral region and configured to transfer a photo charge collected by the common photogate to the plurality of floating diffusion regions; and
a plurality of overflow gates disposed in the peripheral region and configured to drain the photo charge collected by the common photogate.

17. The depth pixel of claim 16, wherein the plurality of demodulation transfer gates is symmetric with respect to each of a horizontal line and a vertical line that pass through a center of the depth pixel and are substantially perpendicular to each other, and the plurality of overflow gates is symmetric with respect to each of the horizontal line and the vertical line.

18. A depth pixel of a time-of flight (ToF) sensor, the depth pixel comprising:
a common photogate disposed in a center region of the depth pixel;
a plurality of floating diffusion regions disposed in a peripheral region surrounding the center region;
a plurality of demodulation transfer gates disposed in the peripheral region and configured to transfer a photo charge collected by the common photogate to the plurality of floating diffusion regions,
wherein the plurality of demodulation transfer gates is symmetric with respect to each of a horizontal line and a vertical line that pass through a center of the depth pixel and are substantially perpendicular to each other; and
a plurality of overflow gates disposed in the peripheral region and configured to drain the photo charge collected by the common photogate,
wherein the plurality of overflow gates is symmetric with respect to each of the horizontal line and the vertical line,
wherein a photogate voltage applied to the common photogate has a direct current (DC) voltage level that causes collecting of the photo charge during an integration period, an overflow gate voltage applied to the plurality of overflow gates has a turn-off voltage level that causes draining of the photo charge to be blocked during the integration period, and a plurality of demodulation signals of different phases is applied to the plurality of demodulation transfer gates during the integration period, wherein the DC voltage level of the photogate voltage during a reset period in which the depth pixel is initialized and a readout period in which an amount of the photo charge collected by the common photogate is measured is different from the DC voltage level during the integration period.

19. The depth pixel of claim 18, wherein the depth pixel has a two-tap structure such that the plurality of demodulation transfer gates includes a first demodulation transfer gate and a second demodulation transfer gate that are symmetrical with respect to the center of the depth pixel, wherein a first demodulation signal is applied to the first demodulation transfer gate and a second demodulation signal having a phase difference of about 180 degrees with respect to the first demodulation signal is applied to the second demodulation transfer gate during the integration period.

* * * * *